(12) United States Patent
Luechinger

(10) Patent No.: US 11,465,224 B2
(45) Date of Patent: Oct. 11, 2022

(54) OVENS FOR EQUIPMENT SUCH AS DIE ATTACH SYSTEMS, FLIP CHIP BONDING SYSTEMS, CLIP ATTACH SYSTEMS, AND RELATED METHODS

(71) Applicant: Kulicke and Soffa Industries, Inc., Fort Washington, PA (US)

(72) Inventor: Christoph Benno Luechinger, Irvine, CA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 15 days.

(21) Appl. No.: 17/349,805

(22) Filed: Jun. 16, 2021

(65) Prior Publication Data

US 2021/0394292 A1 Dec. 23, 2021

Related U.S. Application Data

(60) Provisional application No. 63/040,576, filed on Jun. 18, 2020.

(51) Int. Cl.
*B23K 1/00* (2006.01)
*B23K 1/008* (2006.01)
*H05K 3/34* (2006.01)
*B23K 3/08* (2006.01)
*B23K 101/40* (2006.01)

(52) U.S. Cl.
CPC ............ *B23K 1/008* (2013.01); *B23K 1/0016* (2013.01); *B23K 3/085* (2013.01); *H05K 3/3494* (2013.01); *B23K 2101/40* (2018.08)

(58) Field of Classification Search
CPC ...... B23K 1/008; B23K 1/0016; B23K 3/085; B23K 2101/40; B23K 1/012; B23K 1/015; B23K 28/003; H05K 3/3494; H01L 24/80
See application file for complete search history.

(56) References Cited

U.S. PATENT DOCUMENTS

| | | | | |
|---|---|---|---|---|
| 1,599,589 A | * | 9/1926 | Richardson | F27B 9/3011 |
| | | | | 264/652 |
| 1,747,067 A | * | 2/1930 | Gates | F27B 9/082 |
| | | | | 432/78 |

(Continued)

FOREIGN PATENT DOCUMENTS

| | | | | |
|---|---|---|---|---|
| DE | 102004008621 A1 | * | 9/2005 | ............. C10B 47/32 |
| JP | 08-191059 A | | 7/1996 | |

(Continued)

OTHER PUBLICATIONS

International Search Report completed Oct. 6, 2021; International Patent Application No. PCT/US2021/037705.

*Primary Examiner* — Kiley S Stoner
(74) *Attorney, Agent, or Firm* — Christopher M. Spletzer, Sr.

(57) ABSTRACT

An oven for assisting in conductive joint formation related to a workpiece is provided. The oven includes (a) a chamber, the chamber being at least partially defined by (i) an oven plate and (ii) a cover; (b) a material handling system for moving the workpiece through the oven in connection with a conductive joint formation process; and (c) at least one vacuum chamber within the chamber. The oven provides a stepped temperature profile including a plurality of temperature zones along the oven plate.

30 Claims, 32 Drawing Sheets

(56) References Cited

U.S. PATENT DOCUMENTS

| | | | | |
|---|---|---|---|---|
| 2,375,771 | A * | 5/1945 | Dany | C23D 9/00 |
| | | | | 432/209 |
| 3,756,868 | A * | 9/1973 | Bloom | C21D 1/74 |
| | | | | 148/601 |
| 4,441,003 | A * | 4/1984 | Eves, II | A21B 1/48 |
| | | | | 198/570 |
| 4,589,843 | A * | 5/1986 | Smith | F23D 14/126 |
| | | | | 432/59 |
| 5,039,841 | A * | 8/1991 | Kato | B23K 1/008 |
| | | | | 392/407 |
| 5,716,207 | A * | 2/1998 | Mishina | H01L 21/67098 |
| | | | | 432/5 |
| 5,914,088 | A * | 6/1999 | Rao | C21D 1/04 |
| | | | | 266/252 |
| 6,264,769 | B1 * | 7/2001 | Benedetti | C21D 9/68 |
| | | | | 266/112 |
| 6,289,972 | B1 * | 9/2001 | Benedetti | B21B 1/466 |
| | | | | 164/476 |
| 6,336,980 | B1 * | 1/2002 | Benedetti | C21D 8/06 |
| | | | | 148/653 |
| 6,799,712 | B1 * | 10/2004 | Austen | B23K 1/008 |
| | | | | 228/103 |
| 2003/0224555 | A1 * | 12/2003 | Shiozawa | H01L 21/6835 |
| | | | | 438/108 |
| 2006/0006210 | A1 * | 1/2006 | Nonomura | G05D 23/1951 |
| | | | | 228/101 |
| 2009/0298278 | A1 * | 12/2009 | Tu | B23K 1/0016 |
| | | | | 257/E21.295 |
| 2012/0285295 | A1 * | 11/2012 | Iwasaki | F27B 9/40 |
| | | | | 75/503 |
| 2014/0197153 | A1 * | 7/2014 | Aguilar | B23K 1/012 |
| | | | | 219/482 |
| 2015/0027372 | A1 | 1/2015 | Rathweg | |
| 2015/0090768 | A1 * | 4/2015 | Kuroda | B23K 1/005 |
| | | | | 228/46 |
| 2015/0321278 | A1 * | 11/2015 | Matsuda | B23K 1/0016 |
| | | | | 219/85.13 |
| 2017/0203377 | A1 | 7/2017 | Yokoyama et al. | |
| 2019/0088516 | A1 | 3/2019 | Zhu et al. | |
| 2019/0239516 | A1 * | 8/2019 | Sergent | A21B 1/26 |
| 2020/0001386 | A1 * | 1/2020 | Yamaguchi | B23K 3/0478 |

FOREIGN PATENT DOCUMENTS

| | | | | |
|---|---|---|---|---|
| JP | 11121921 A | * | 4/1999 | H01L 24/75 |
| JP | 2004025274 A | * | 1/2004 | |
| KR | 10-2006-0133485 A | | 12/2006 | |
| KR | 100724587 B1 | * | 6/2007 | |

* cited by examiner

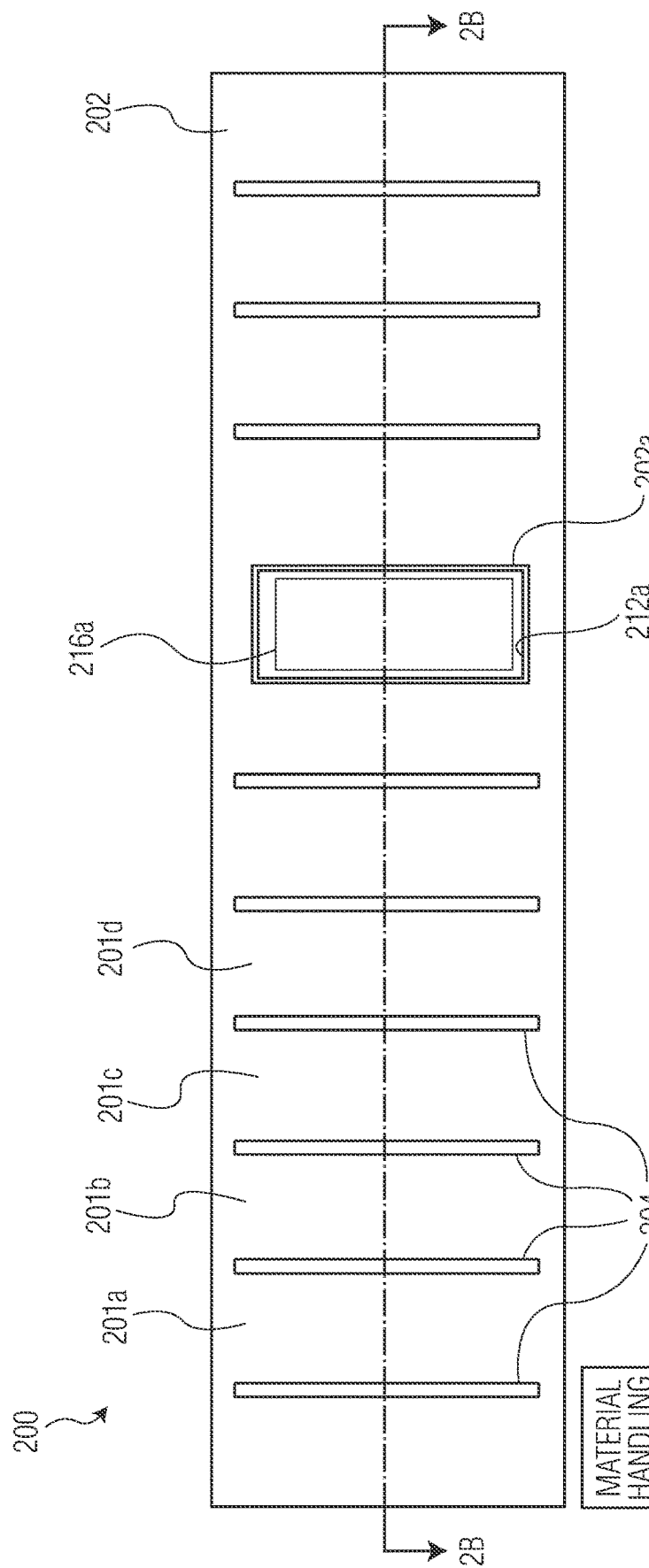

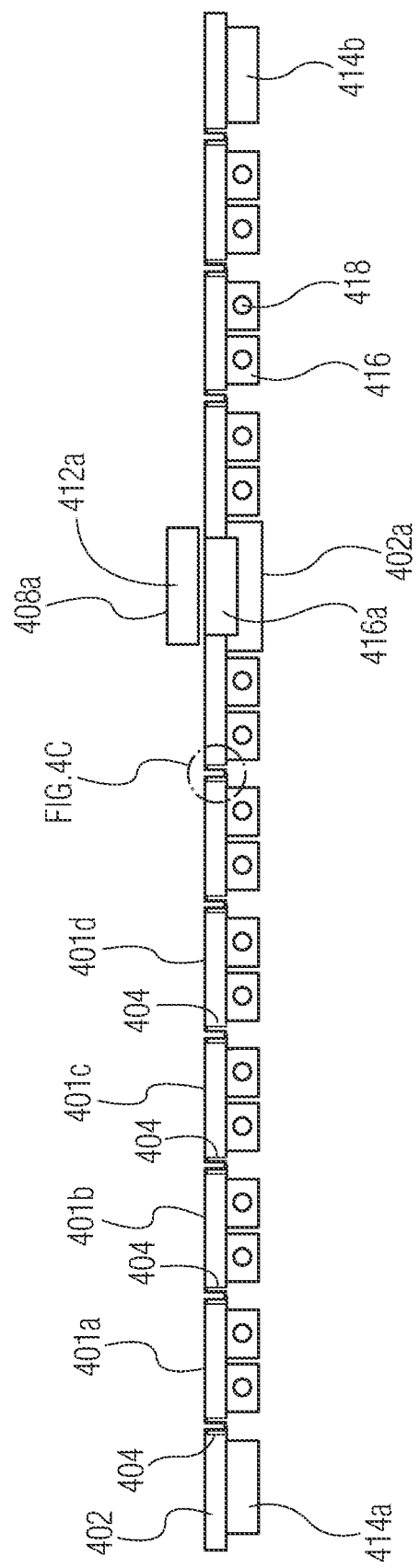

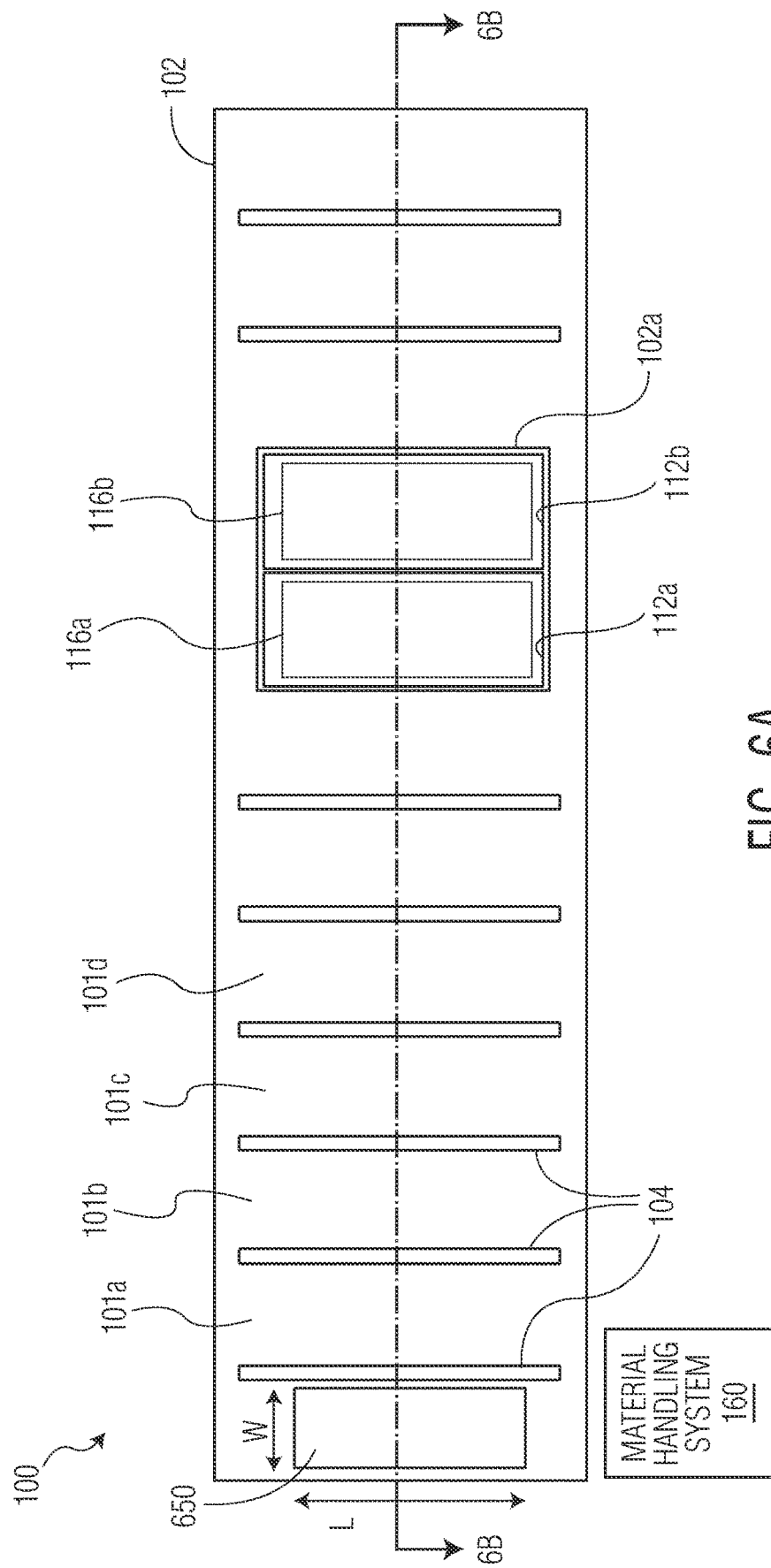

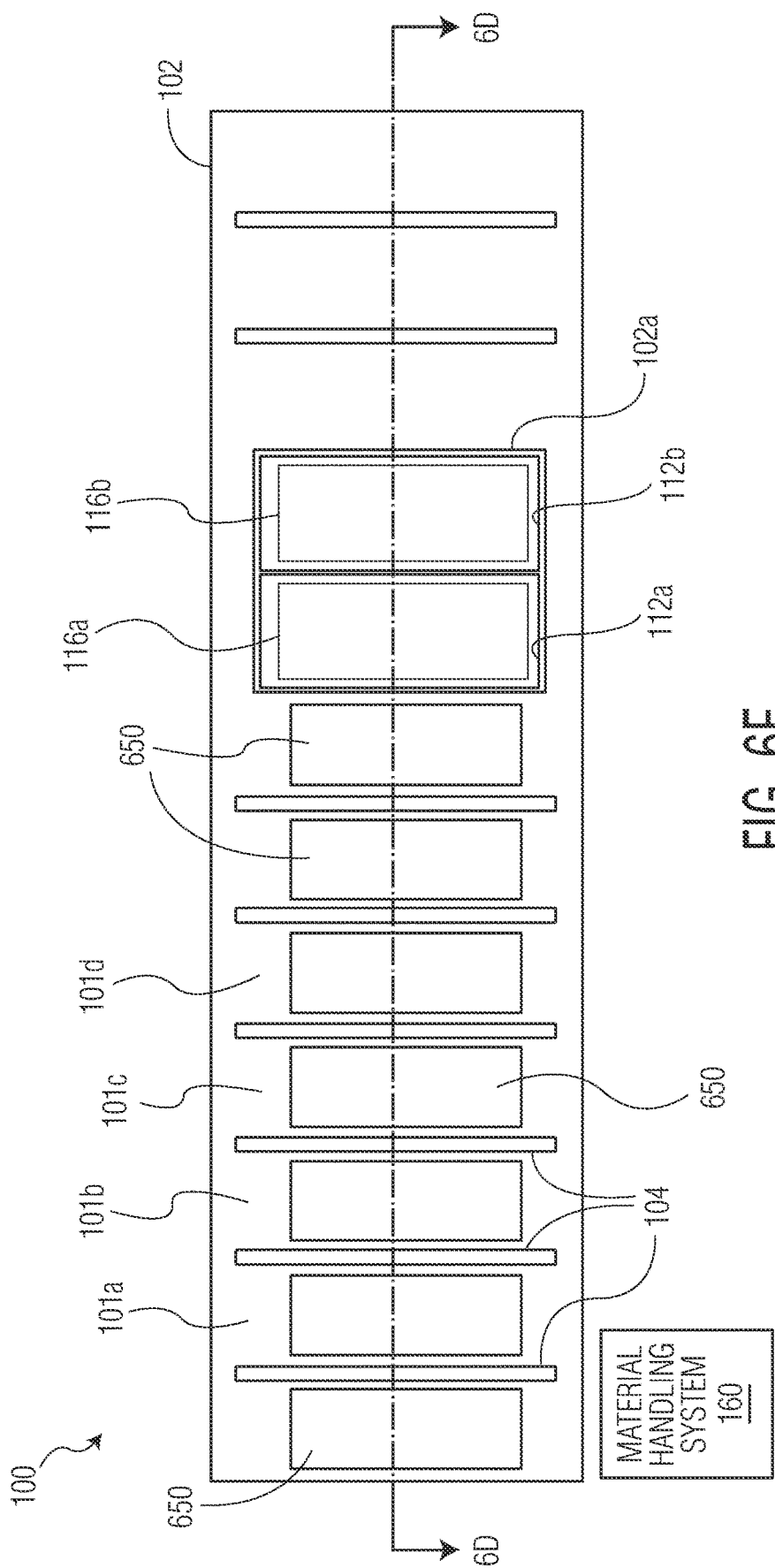

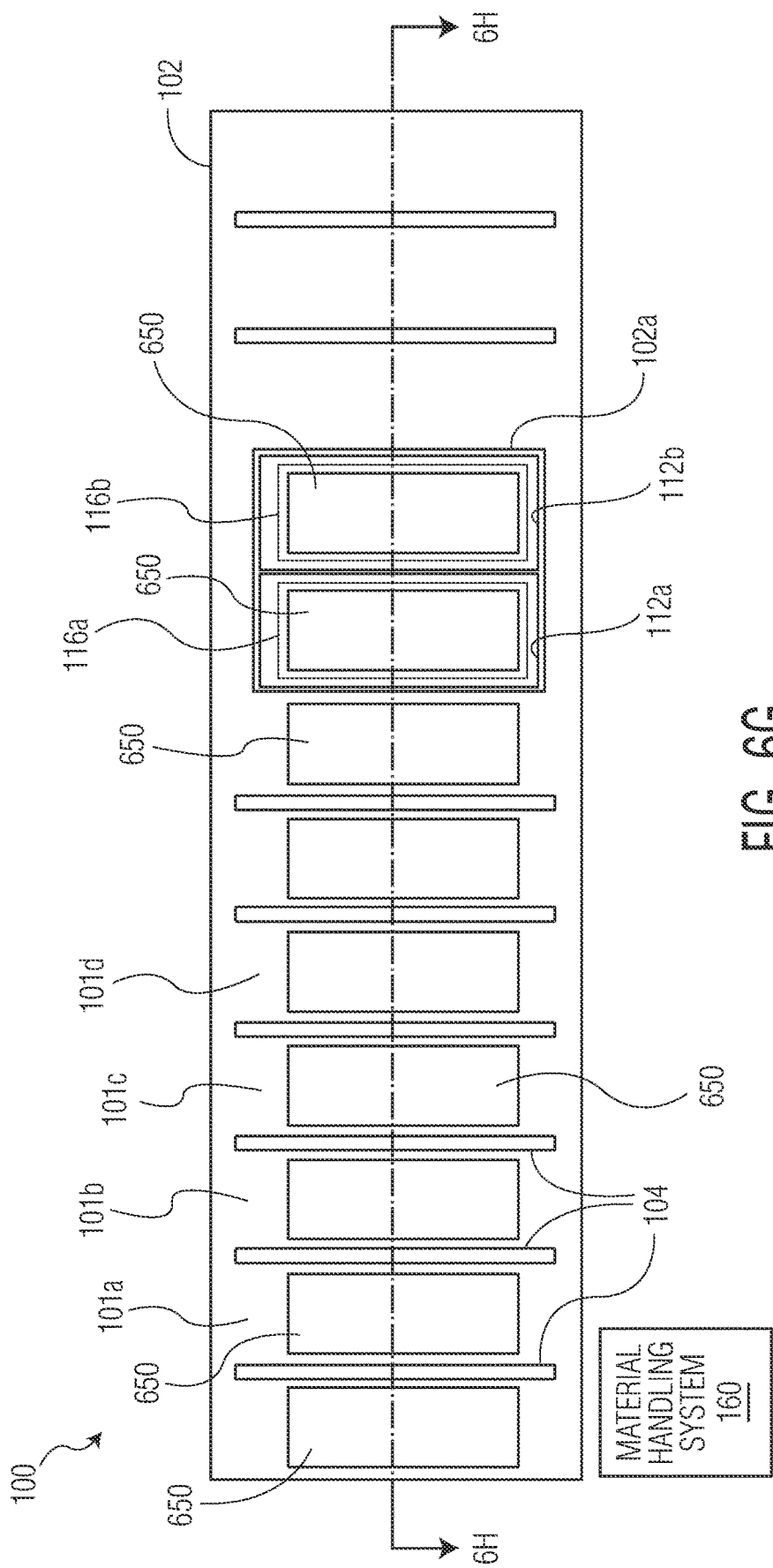

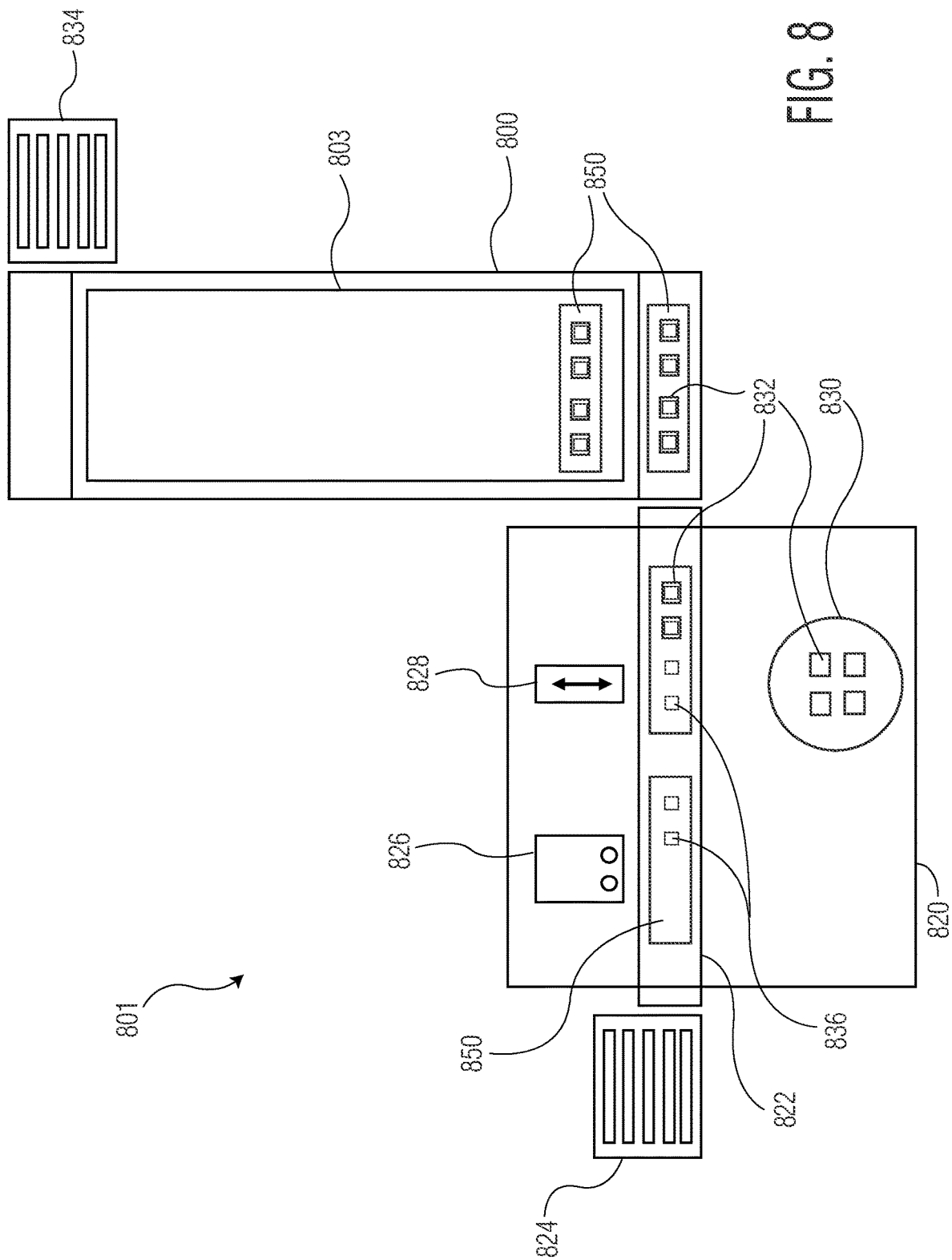

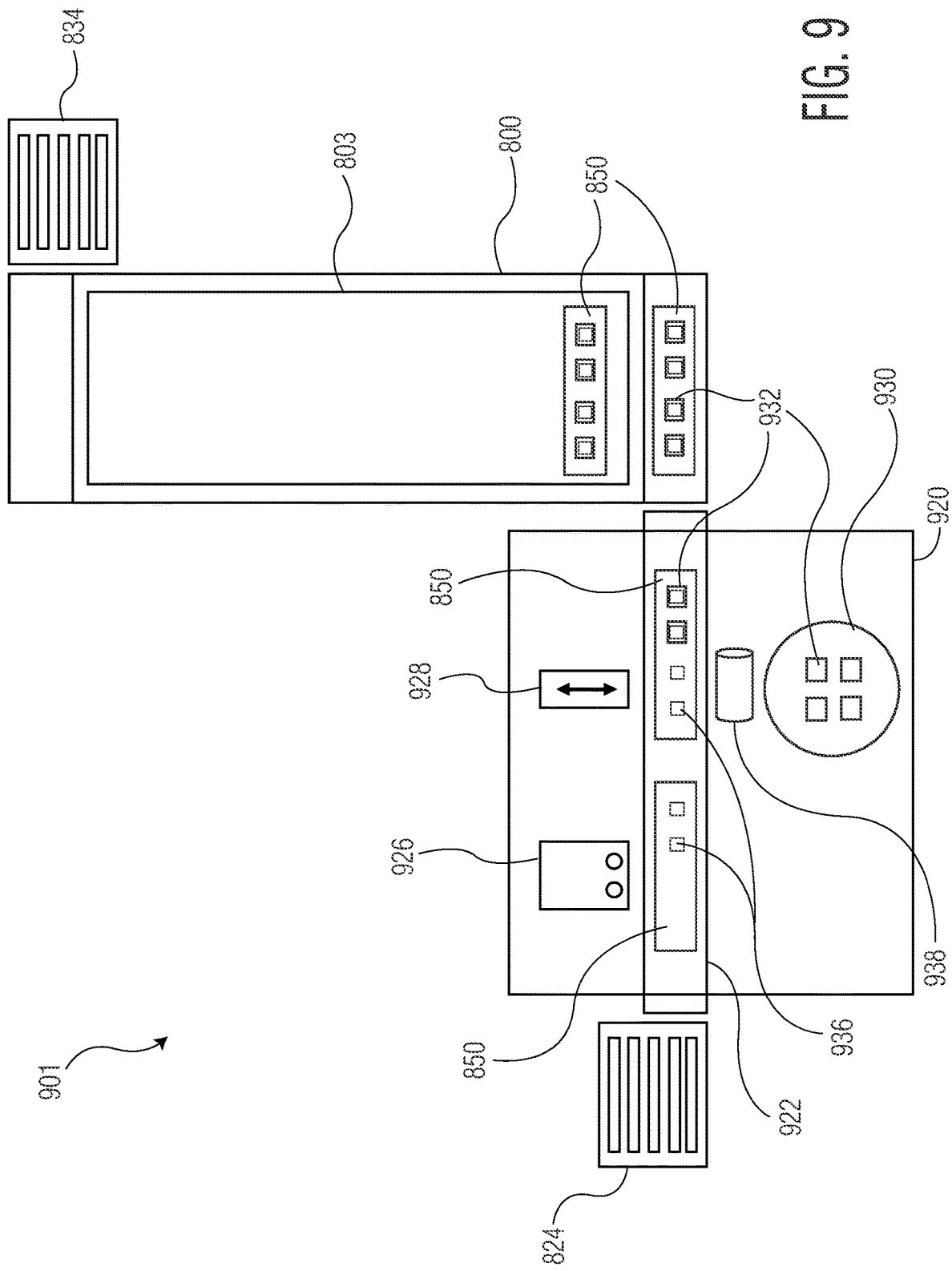

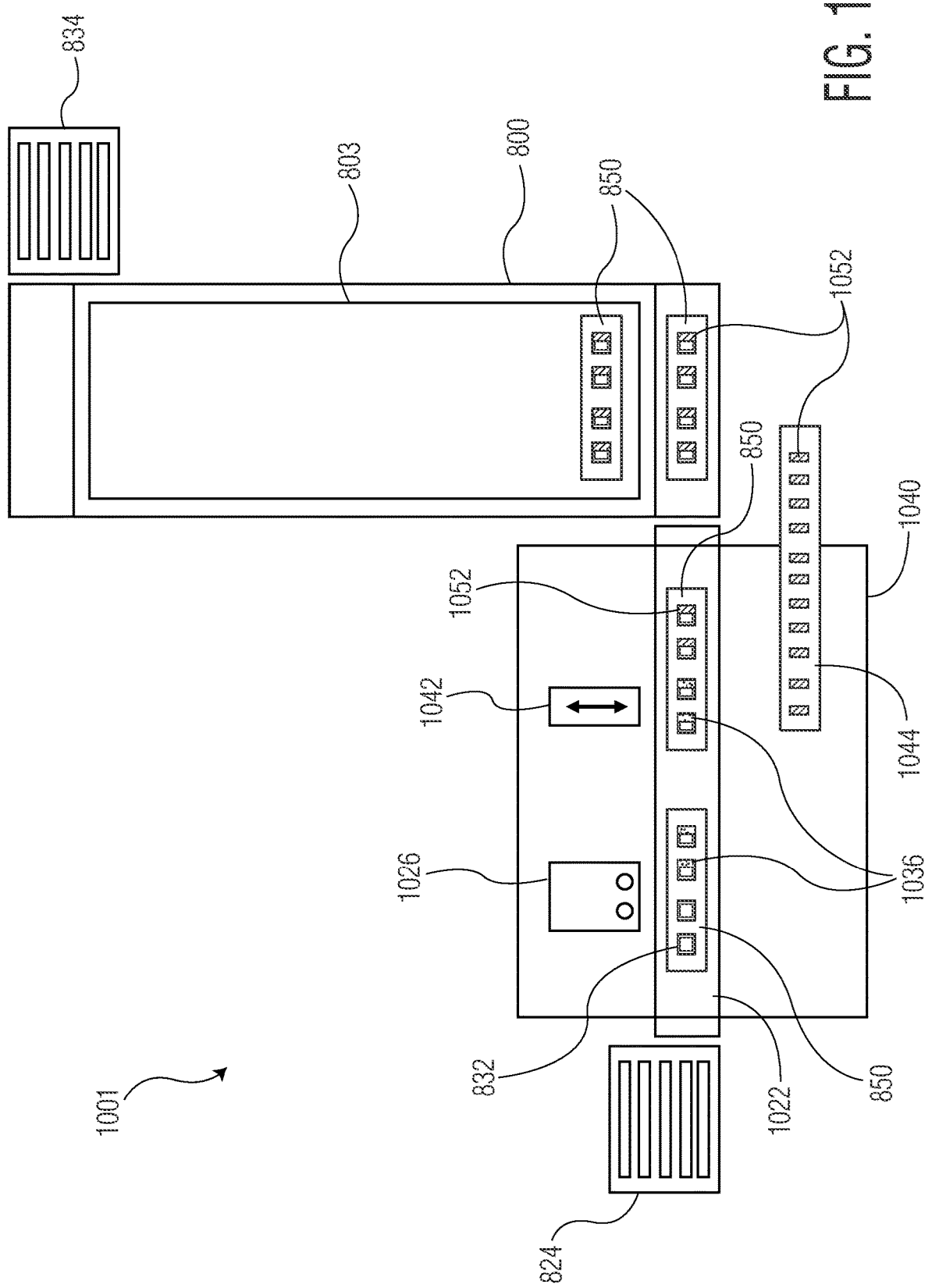

OVENS FOR EQUIPMENT SUCH AS DIE ATTACH SYSTEMS, FLIP CHIP BONDING SYSTEMS, CLIP ATTACH SYSTEMS, AND RELATED METHODS

CROSS-REFERENCE TO RELATED APPLICATION

This application claims the benefit of U.S. Provisional Application No. 63/040,576, filed Jun. 18, 2020, the content of which is incorporated herein by reference.

FIELD

The invention relates to ovens for equipment such as die attach systems, flip chip bonding systems, clip attach systems, and related methods.

BACKGROUND

In the electronics assembly industry (e.g., including die attach, flip chip bonding, clip attach, etc.), connections including solder material are often used. For example, in certain conventional die attach applications, soft solder interconnections may be used. In other examples, in certain clip attach applications, solder reflow interconnections may be used.

In connection with such die attach and clip attach applications, an oven may be used in the interconnection process (e.g., in connection with the solder reflow process).

There are many factors to consider when designing such ovens. For example: processing time of workpieces (e.g., units per hour); temperature control as workpieces move through the oven; accessibility of the components of the oven (e.g., for maintenance, cleaning, etc.); among others.

Thus, it would be desirable to provide improved ovens, and related equipment and processes, for use in the electronics assembly industry.

SUMMARY

According to an exemplary embodiment of the invention, an oven for assisting in conductive joint formation related to a workpiece is provided. The oven includes (a) a chamber, the chamber being at least partially defined by (i) an oven plate and (ii) a cover; (b) a material handling system for moving the workpiece through the oven in connection with a conductive joint formation process; and (c) at least one vacuum chamber within the chamber. The oven provides a stepped temperature profile including a plurality of temperature zones along the oven plate.

According to another exemplary embodiment of the invention, a die attach system is provided. The die attach system includes: a die source including a plurality of die; a support structure for supporting a workpiece; a placement system for transferring at least one of the plurality of die from the die source to the workpiece; and an oven for assisting in conductive joint formation related to the workpiece after placement of the at least one of the plurality of die using the placement system. The oven includes: (a) a chamber, the chamber being at least partially defined by (i) an oven plate and (ii) a cover; (b) a material handling system for moving the workpiece through the oven in connection with a conductive joint formation process; and (c) at least one vacuum chamber within the chamber. The oven provides a stepped temperature profile including a plurality of temperature zones along the oven plate.

According to yet another exemplary embodiment of the invention, a flip chip bonding system is provided. The flip chip bonding system includes: a die source including a plurality of die; a support structure for supporting a workpiece; a flip chip placement system for transferring at least one of the plurality of die from the die source to the workpiece; and an oven for assisting in conductive joint formation related to the workpiece after placement of the at least one of the plurality of die using the placement system. The oven includes: (a) a chamber, the chamber being at least partially defined by (i) an oven plate and (ii) a cover; (b) a material handling system for moving the workpiece through the oven in connection with a conductive joint formation process; and (c) at least one vacuum chamber within the chamber. The oven provides a stepped temperature profile including a plurality of temperature zones along the oven plate.

According to yet another exemplary embodiment of the invention, a clip attach system is provided. The clip attach system includes: a clip source including a plurality of conductive clips; a support structure for supporting a workpiece; a clip placement system for placing at least one of the plurality of conductive clips on the workpiece; and an oven for assisting in conductive joint formation related to the workpiece after placement of the at least one of the plurality of clips using the clip placement system. The oven includes: (a) a chamber, the chamber being at least partially defined by (i) an oven plate and (ii) a cover; (b) a material handling system for moving the workpiece through the oven in connection with a conductive joint formation process; and (c) at least one vacuum chamber within the chamber. The oven provides a stepped temperature profile including a plurality of temperature zones along the oven plate.

According to yet another exemplary embodiment of the invention, a method of designing an oven for providing conductive joint formation is provided. The method includes the steps of: (a) determining a stepped temperature profile to be provided within a chamber of the oven, the chamber being at least partially defined by (i) an oven plate of the oven and (ii) a cover of the oven, the chamber including at least one vacuum chamber; and (b) providing design details for the oven such that the stepped temperature profile includes a plurality of temperature zones along the oven plate.

Details of any of the ovens described herein may be incorporated into such a method of designing an oven for providing conductive joint formation. Non-limiting details of such ovens include: the oven being configured to provide a substantially uniform temperature within each of the plurality of temperature zones; the oven plate being designed to define a plurality of grooves, the plurality of grooves defining the plurality of temperature zones along the oven plate; the oven plate being designed to define a single one of the plurality of grooves between each of the plurality of temperature zones along the oven plate; the oven plate being designed to define a subset of the plurality of grooves between each of the plurality of temperature zones along the oven plate; and the oven plate being designed such that at least one groove of the subset of the plurality of grooves is provided with an active cooling fluid.

Aspects of the inventive methods also relate to the customization of a stepped temperature profile. There are a number of variables in the oven design such as, for example: groove details; active cooling fluid details; heater operation (e.g., operation of the individual heating blocks); among others. For example, at least two heater elements (e.g., heaters, heating blocks, etc.) may be provided for each of the plurality of temperature zones, with the at least two heater elements being separately controllable. Such variables may be optimized such that the stepped temperature profile may be customized for a given application to provide a desired stepped temperature profile.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIG. 2A is a block diagram top view of another oven in accordance with another exemplary embodiment of the invention;

FIG. 4B is a side view of the oven of FIG. 4A;

FIGS. 6A-6H are a series of top and side block diagram views of the oven of FIG. 1A, illustrating a method of operating the oven, in accordance with an exemplary embodiment of the invention;

FIG. 8 is a block diagram illustration of a die attach system in accordance with an exemplary embodiment of the invention;

FIG. 9 is a block diagram illustration of a flip chip bonding system in accordance with an exemplary embodiment of the invention;

FIG. 10 is a block diagram illustration of a clip attach system in accordance with an exemplary embodiment of the invention;

DETAILED DESCRIPTION

Figure 1A:
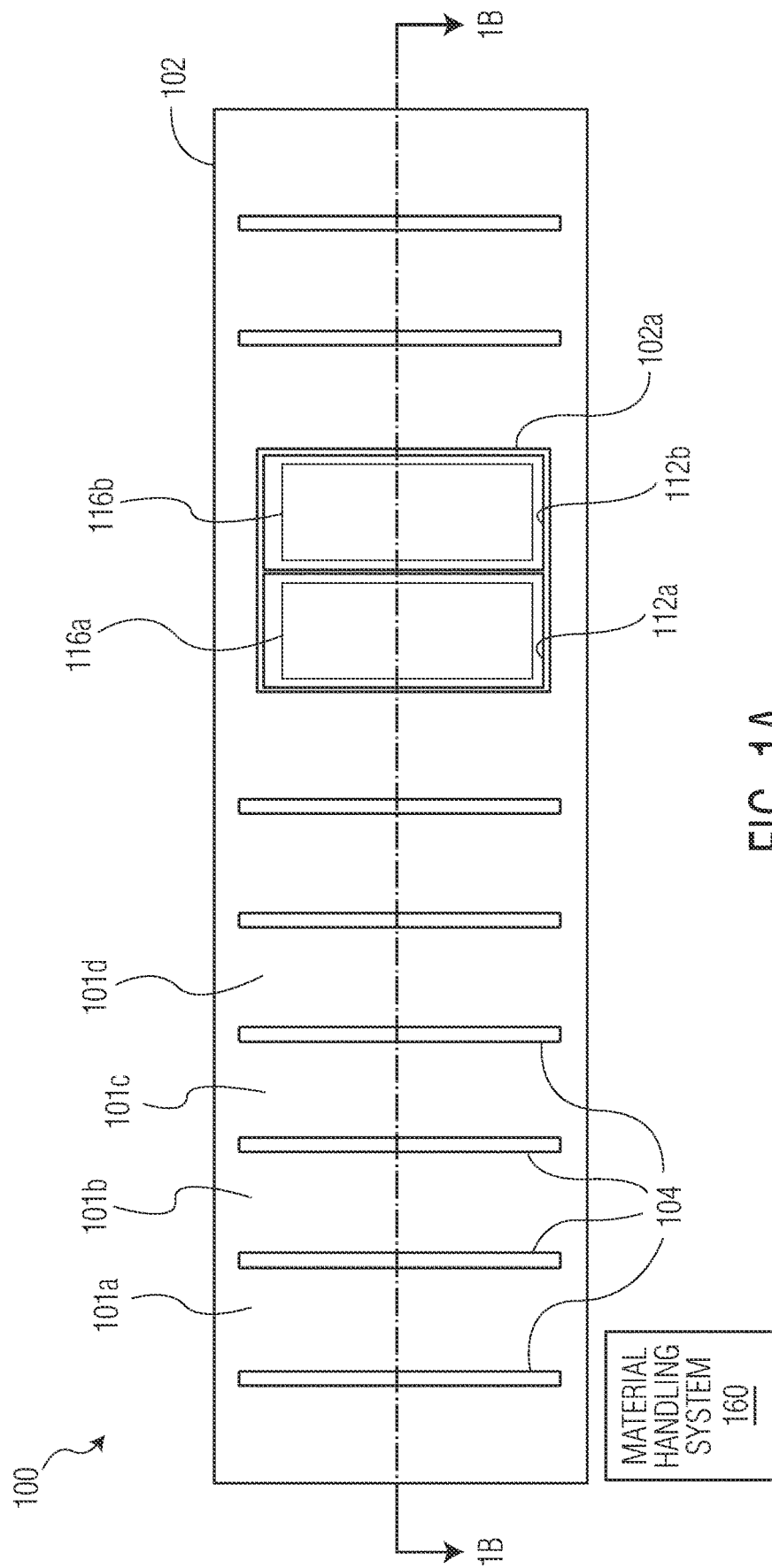
FIG. 1A is a block diagram top view of an oven in accordance with an exemplary embodiment of the invention.

Aspects of the invention relate to ovens for assisting in conductive joint formation processes for a workpiece. There are many types of applications where such an oven would be useful. For example, the conductive joint formation process may be in connection with a die attach system, a flip chip bonding system, a clip attach system (which may include a die attach system, a flip chip bonding system, etc.).

The conductive joint formation process may include, for example, at least one of a sintered coupling process and a soldered coupling process (e.g., a solder reflow coupling process). Other conductive joint formation processes are contemplated.

The workpieces that undergo such a conductive joint formation process in an oven may vary widely. For example, the workpiece may include (i) a plurality of die, (ii) a substrate, and (iii) a plurality of conductive clips configured to provide conductive coupling between ones of the plurality of die and the substrate using a solder reflow process in the oven. In another example, the workpiece may include (i) a plurality of die, and (ii) a plurality of conductive clips configured to be conductively coupled to respective ones of the plurality of die using a solder reflow process in the oven. In yet another example, the workpiece may include (i) a die, and (ii) a substrate, and (iii) at least one conductive clip configured to provide conductive coupling between the die and the substrate using a solder reflow process in the oven. In yet another example, the workpiece may include (i) a die, and (ii) at least one conductive clip configured to be conductively coupled to the die using a solder reflow process in the oven. In yet another example, the workpiece may include a plurality of die and a substrate, the plurality of die being configured to be conductively coupled to the substrate using a solder reflow process in the oven. In yet another example, the workpiece may include a die and a substrate, the die being configured to be conductively coupled to the substrate using solder reflow in the oven. Other types of workpieces (and conductive connections) are contemplated.

Aspects of the invention relate to ovens (and methods of operating the same) that achieve desirable control for a wide range of temperature profiles to optimally support solder reflow processes.

Aspects of the invention are particularly useful in connection with applications that implement solder reflow under vacuum to improve the solder layer integrity by reducing the void content significantly. While only a specific portion of a solder reflow process occurs under vacuum, the entire workpiece is typically under vacuum at the same time. This could result in an interruption of the stepwise transport along a continuous temperature profile. To have all parts of a leadframe encounter the same temperature profile along the rest of the oven, a profile desirably has a "stair-step" shape, with a temperature desirably within ±5° C. in the step area, which must have a length equal to the width of at least one lead frame, and a sharp transition in between.

However, due to the lateral thermal conductivity of the oven plate this is difficult to achieve on a continuous oven plate, even when using low thermal conductivity steel. One alternative design approach would be to use the oven plate as an enclosure, and to create each heating zone with an individual heater block which is largely thermally isolated from the oven plate. A disadvantage of this design approach is that the heating elements will be inside the oven, with a sealed electrical feed for the power and thermocouple wires. Further, an oven with many cavities can be difficult to clean (e.g., to remove process contamination). Further still, providing a controlled gas flow with limited gas consumption would be very difficult.

Exemplary embodiments of the invention relate to an isolation concept which enables sufficient thermal isolation between the zones to fulfill all temperature profile requirements (e.g., ±5° C. uniformity within each zone) for a wide range of zone to zone temperature differences, to support all known reflow temperature profiles.

Aspects of the invention: enable the implementation of a vacuum reflow zone/chamber; improve the control of the temperature profile seen by an individual part anywhere on a workpiece or leadframe, and from leadframe to leadframe; and/or improve the heating efficiency by minimizing the number of index steps (i.e., by maximizing the time the workpiece is in contact with the oven plate).

Any of the ovens (or features of ovens) described herein may be incorporated into a die attach system, a flip chip bonding system, a clip attach system, or other equipment (e.g., placement equipment) within the scope of the invention. Any of the systems according to the invention (e.g., die attach systems, flip chip bonding systems, clip attach systems, etc.) may include multiple placement systems (multiple of the same type of placement system such as die pick and place systems, flip chip pick and place systems, clip attach systems) (multiple placement systems of differing types such as a die pick and place system and a clip attach system) in connection with a single oven.

In accordance with the invention, a combined system including die attach and clip attach (and/or flip chip bonding and clip attach) may be at a single location, or different locations (e.g., the die attach system might be at a different location compared to the clip attach system).

In accordance with certain exemplary aspects of the invention, grooves (or other temperature isolation features) may be provided along an oven plate of an oven. Certain embodiments of the invention relate to having multiple temperature zones along the oven plate. For example, a purpose of the grooves (or other temperature isolation features of the oven plate) may be to minimize a heat flow from one side of a groove to another side of a groove (e.g., from one temperature zone to another temperature zone). Such grooves may achieve this purpose through design choices that control a thermal resistance provided by the grooves. For example, the thermal resistance increases with a longer path (e.g., a longer or deeper groove) for heat flow.

Figure 1B:
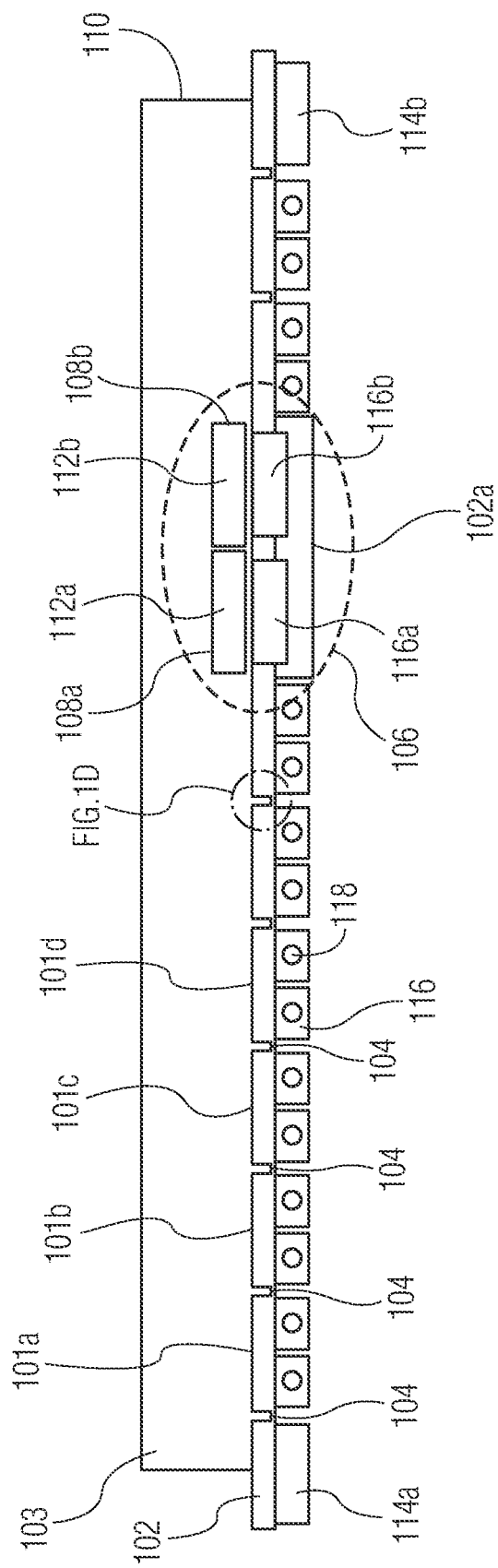
FIG. 1B is a block diagram side view of the oven of FIG. 1A.

Referring now to FIGS. 1A-1D, an oven 100 is shown. FIG. 1A is a top view of oven 100, with cover 110 removed for simplicity. FIG. 1B is a side view of oven 100. Oven 100 includes an oven plate 102 and a cover 110. Oven 100 also includes a chamber 103 defined at least partially by oven plate 102 and cover 110. Chamber 103 encloses a portion of oven 100, for example, to provide a controlled environment. Oven 100 also includes a material handling system 160 (e.g., a conveyor system, a walking beam motion system, a gripper-based system, etc.) for moving a workpiece through oven 100 in connection with a conductive joint formation process.

Oven 100 is configured to include a plurality of temperature zones 101a, 101b, 101c, 101d, etc. along oven plate 102. Oven plate 102 defines a plurality of grooves 104, wherein each of the plurality of grooves 104 separates adjacent temperature zones. For example, temperature zone 101a is separated from temperature zone 101b by one of the plurality of grooves 104, etc.

A plurality of heating blocks 116 are distributed beneath oven plate 102 and between grooves 104, as shown on FIG. 1B. Heating blocks 116 are heated using heater rods 118 (i.e., a heating element) and control the temperature of respective temperature zones (e.g., 101a, 101b, etc.). In the embodiment of the invention shown in FIG. 1B, two heating blocks 116 (that may be independently controlled, from each other, and from other heating blocks 116 included in oven 100) are provided beneath each of the plurality of temperature zones (excluding the temperature zones of vacuum chamber 112a and 112b).

Oven 100 also includes a region 106, including vacuum chambers 112a and 112b within chamber 103. Region 106 includes a vacuum insert 102a provided in oven plate 102. That is, instead of oven plate 102 being continuous along the entire length of oven 100, an additional element (i.e., vacuum insert 102a) is provided in region 106. Thus, vacuum insert 102a provides a surface upon which workpieces can travel in region 106.

Oven 100 includes a vacuum chamber 112a and a vacuum chamber 112b, both in region 106. Vacuum chamber 112a includes cover 108a that covers a portion of a vacuum insert 102a. Vacuum chamber 112b includes cover 108b that covers another portion of vacuum insert 102a. Region 106 includes heating blocks 116a and 116b (as opposed to heating blocks 116 included in the remainder of oven 100). More specifically, heating block 116a is provided to heat vacuum chamber 112a, and heating block 116b is provided to heat vacuum chamber 112b. Heating blocks 116a, 116b may be independently controlled from each other, and from other heating blocks 116 included in oven 100.

In accordance with certain exemplary embodiments of the invention, one or more vacuum chambers may be provided along an oven plate (e.g., see various vacuum chambers described in connection with FIGS. 1A-1D, 2A-2C, 3A-3C, 4A-4C, and 5A-5C). Such vacuum chambers (such as vacuum chambers 112a, 112b) allow for solder reflow under vacuum to improve the solder layer integrity by reducing the void content significantly. While only a specific portion of the reflow process occurs under vacuum (e.g., in the various vacuum chambers described herein), a complete workpiece is desirably under vacuum at once.

In accordance with certain exemplary embodiments of the invention, a stepped temperature profile including a plurality of temperature zones (e.g., temperature zones 101a, 101b, 101c, 101d, etc.) may be provided by oven 100 along oven plate 102. Such a stepped temperature profile may be provided through the inclusion of grooves 104 in oven plate 102, and through the control of heaters 116 (as well as heaters 116a, 116b).

Figure 1C:
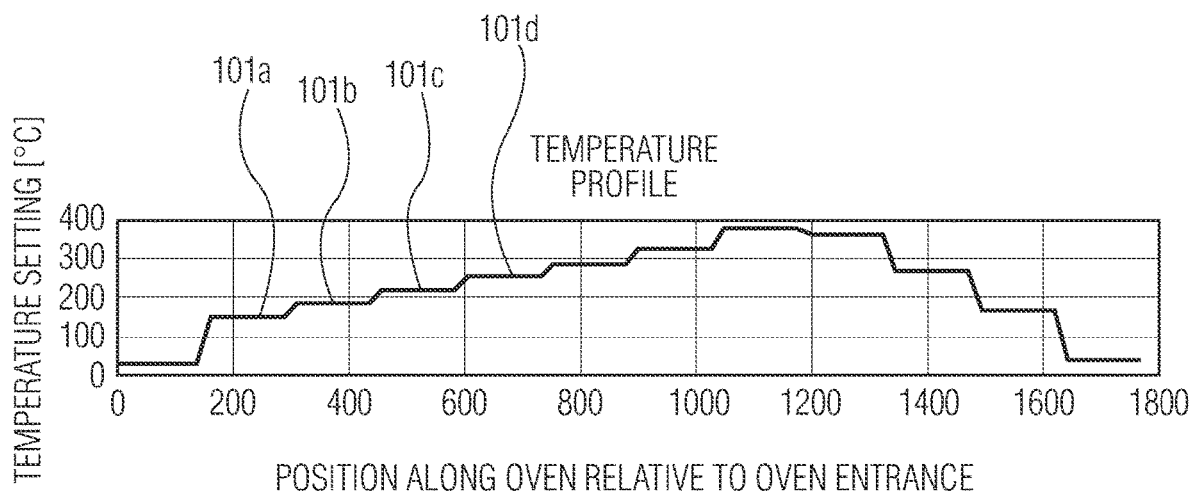
FIG. 1C is an exemplary stepped temperature profile including a plurality of temperature zones of the oven of FIG. 1A.
Figure 1D:
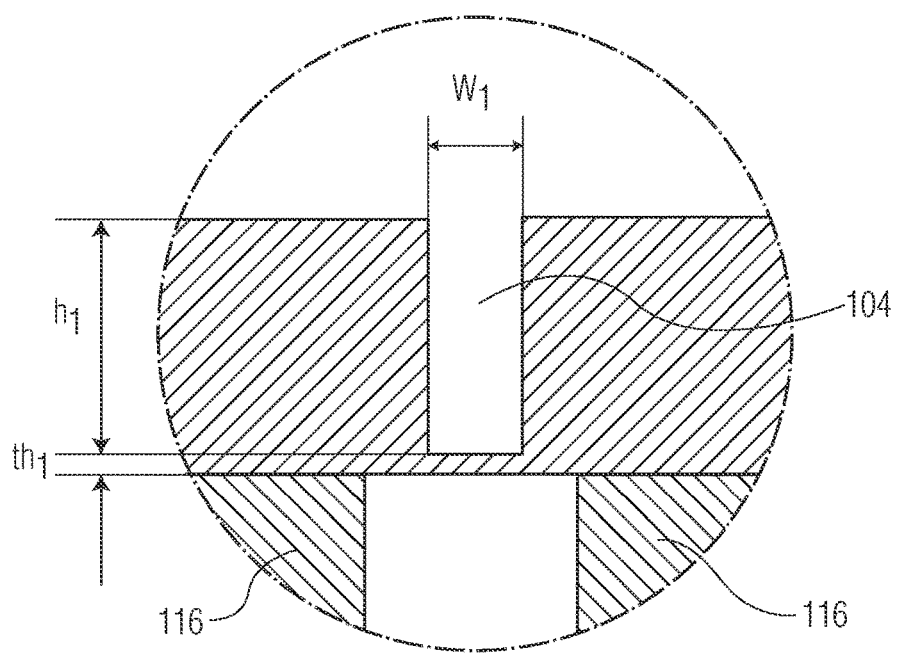
FIG. 1D is a detailed view of a groove of the oven of FIG. 1A.

Oven 100 also includes entrance cooling block 114a and exit cooling block 114b (with the plurality of temperature zones 101a, 101b, 101c, 101d, etc. provided therebetween). An exemplary stepped temperature profile (with controlled temperatures at each of the plurality of temperature zones, in a "stepped" configuration, with a substantially constant temperature at each step) is shown in FIG. 1C. Stepped temperature profiles, in accordance with the invention, may be customized for a given application to provide a desired stepped temperature profile. That is, in a given application (e.g., in a specific solder reflow application) certain temperatures may be desired for certain periods of time while a workpiece is moved through an oven. Customization of a stepped temperature profile may be accomplished by, for example, controlling the heat output of heaters 116, adjusting details of grooves 104 (e.g., the placement of the grooves, the number of grooves, the width of the grooves, details of a cooling fluid which may be provided in one or more grooves, etc.), among others as an application requires. FIG. 1D illustrates a cross-sectional side view of groove 104. Groove 104 has a width $W_1$, a height $h_1$, and a lower wall thickness $th_1$, as shown in FIG. 1D.

Figure 2B:
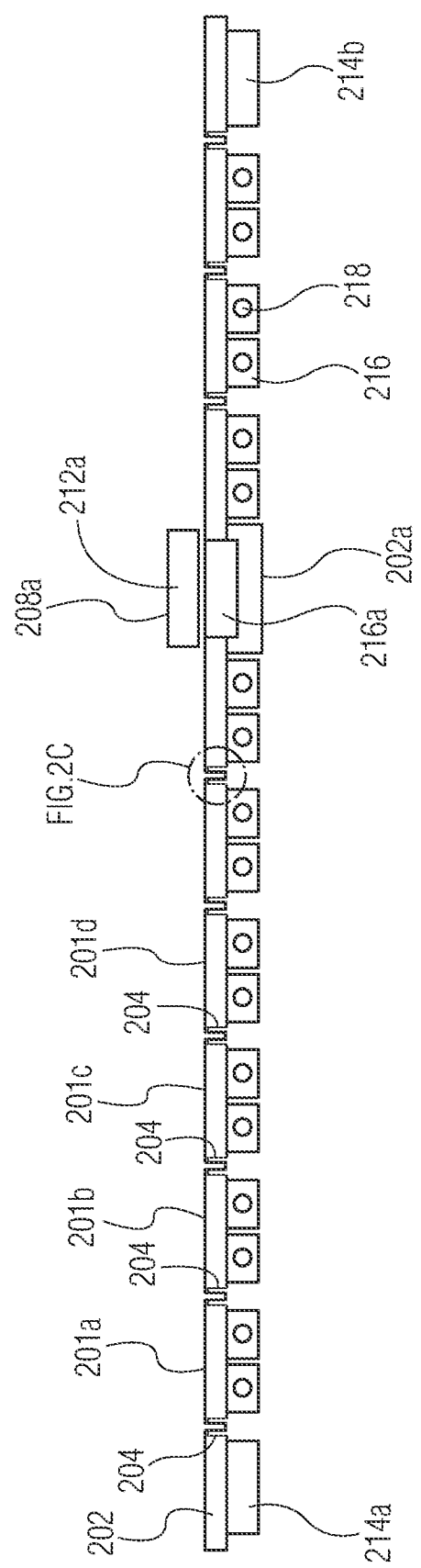
FIG. 2B is a block diagram side view of the oven of FIG. 2A.
Figure 2C:
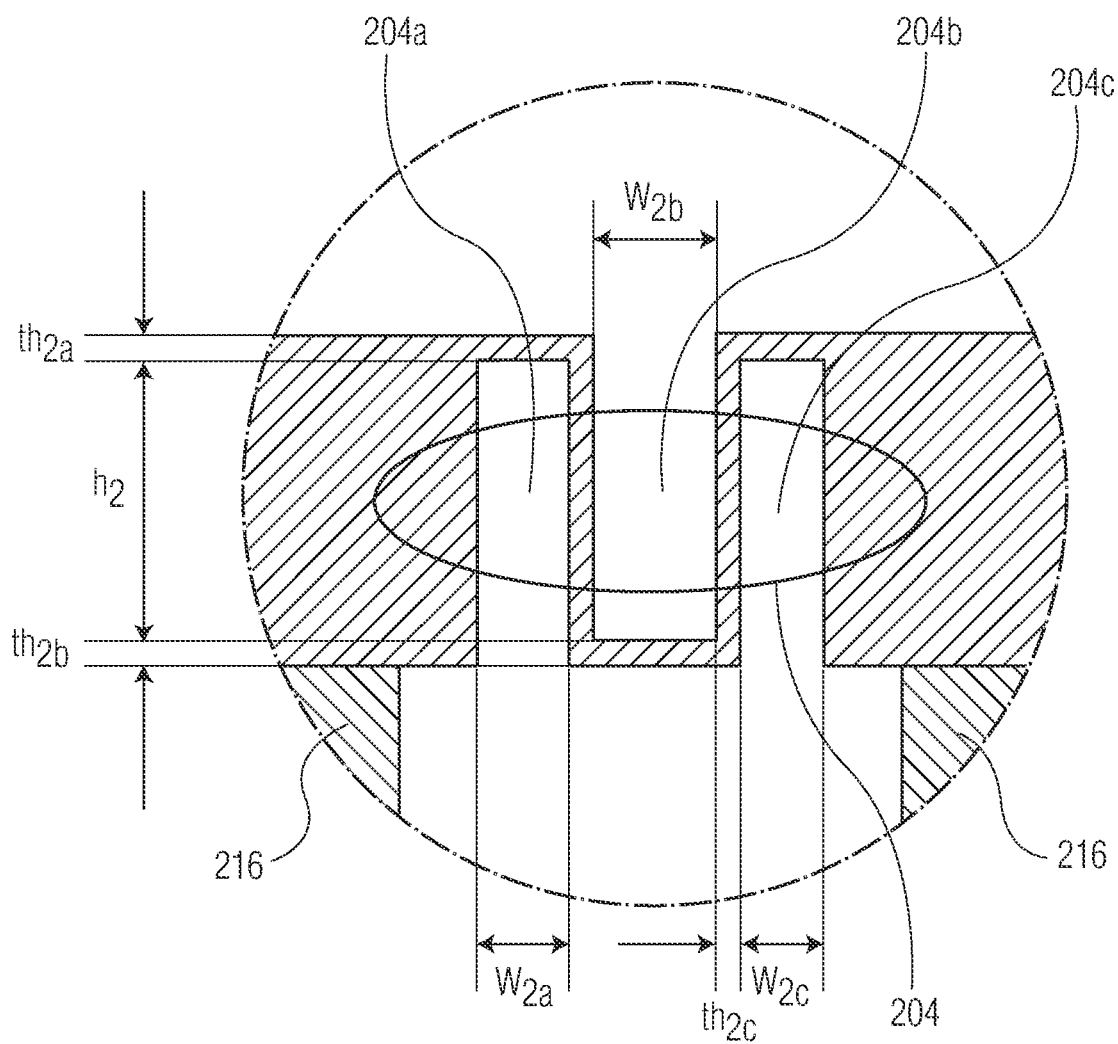
FIG. 2C is a detailed view of a groove of the oven of FIG. 2A.

Referring now to FIGS. 2A-2C, oven 200 is shown which is similar to oven 100 (where like elements have the same reference numerals, or a numeral beginning with a "2" instead of a "1") except with a single vacuum chamber 212a and a different groove configuration. Oven 200 includes a cover (similar to cover 110 shown in FIG. 1B); however, it is omitted from the drawings for simplicity. Groove structure 204 is labelled in FIG. 2A (shown in detail in the cross-sectional view of FIG. 2C), and includes a subset of grooves (e.g., 204a, 204b, and 204c). This subset of grooves 204a, 204b, 204c is used to provide a stepped temperature profile between the plurality of temperature zones 201a, 201b, 201c, 201d, etc. (with controlled temperatures at each of the plurality of temperature zones, in a "stepped" configuration). Groove 204a has a width $W_{2a}$ and a height $h_2$, groove 204b has a width $W_{2b}$ and a height $h_2$, and groove 204c has a width $W_2c$ and a height $h_2$. Grooves 204a, 204b, and 204c are defined by wall portions including an upper wall having a thickness $th_{2a}$, a lower wall having a thickness $th_{2b}$, and side walls having a thickness $th_{2c}$.

Figure 3A:
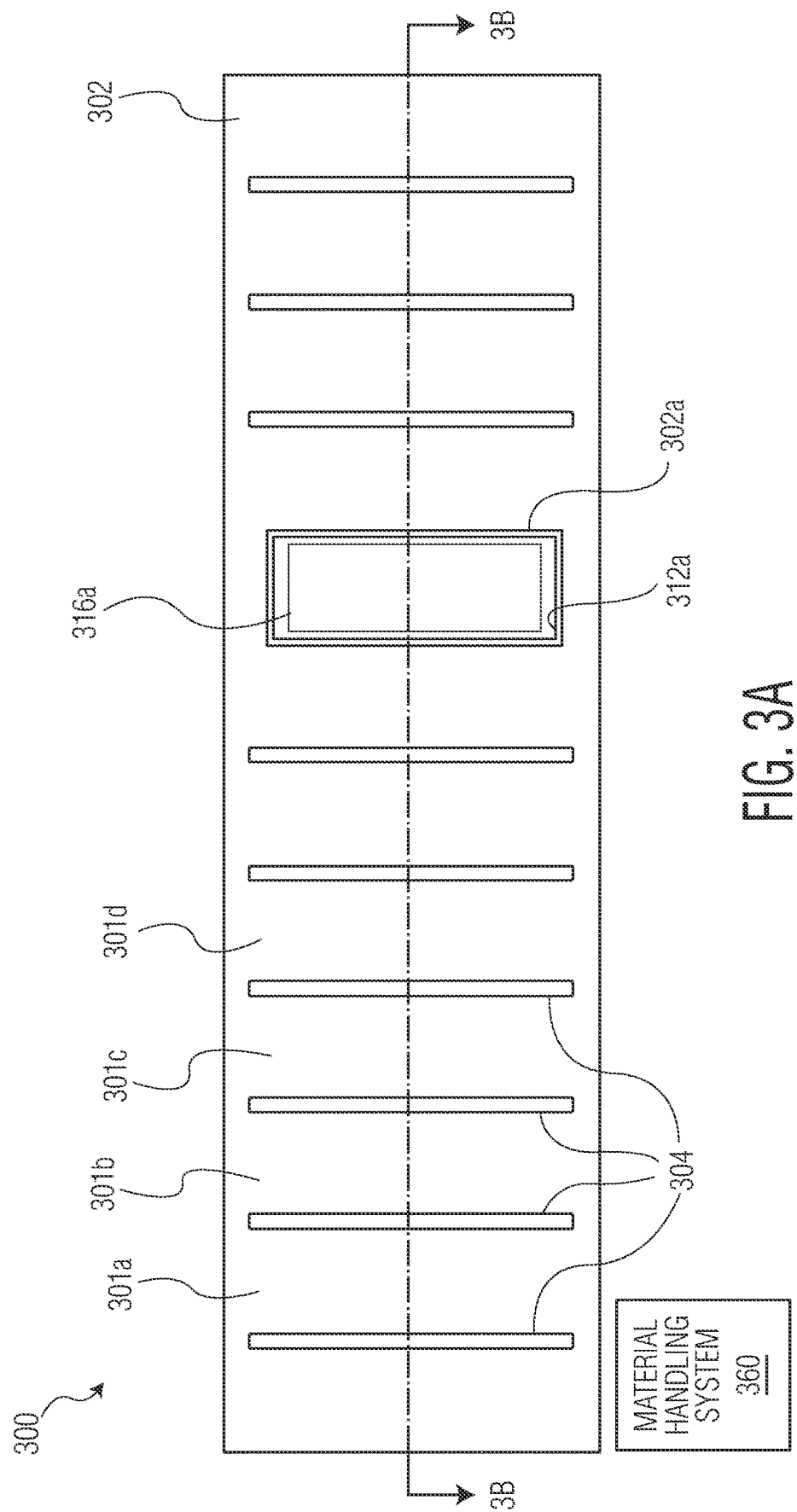
FIG. 3A is a block diagram top view of yet another oven in accordance with yet another exemplary embodiment of the invention.
Figure 3B:
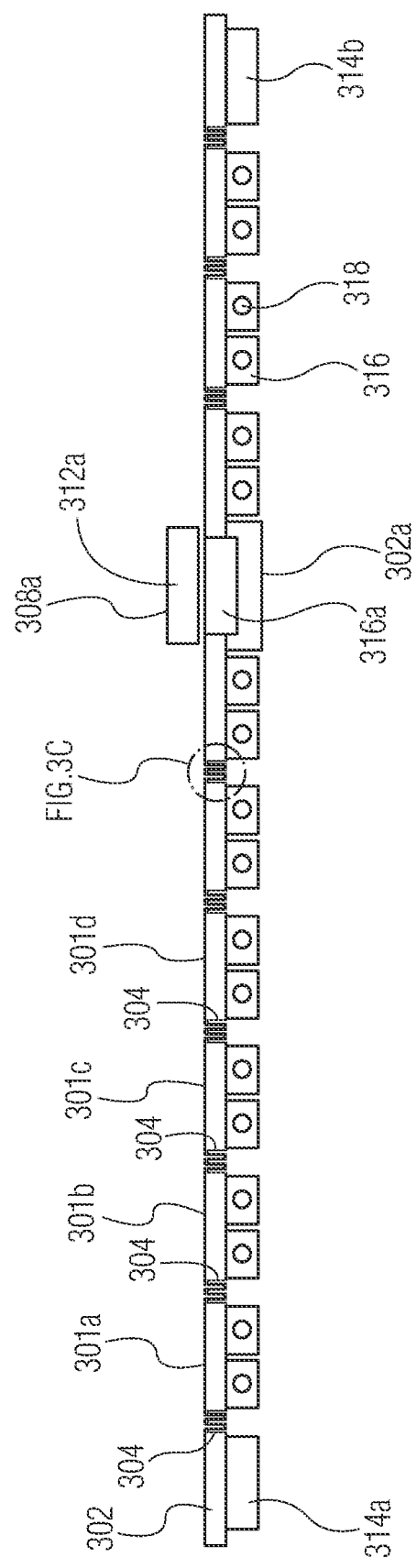
FIG. 3B is a block diagram side view of the oven of FIG. 3A.
Figure 3C:
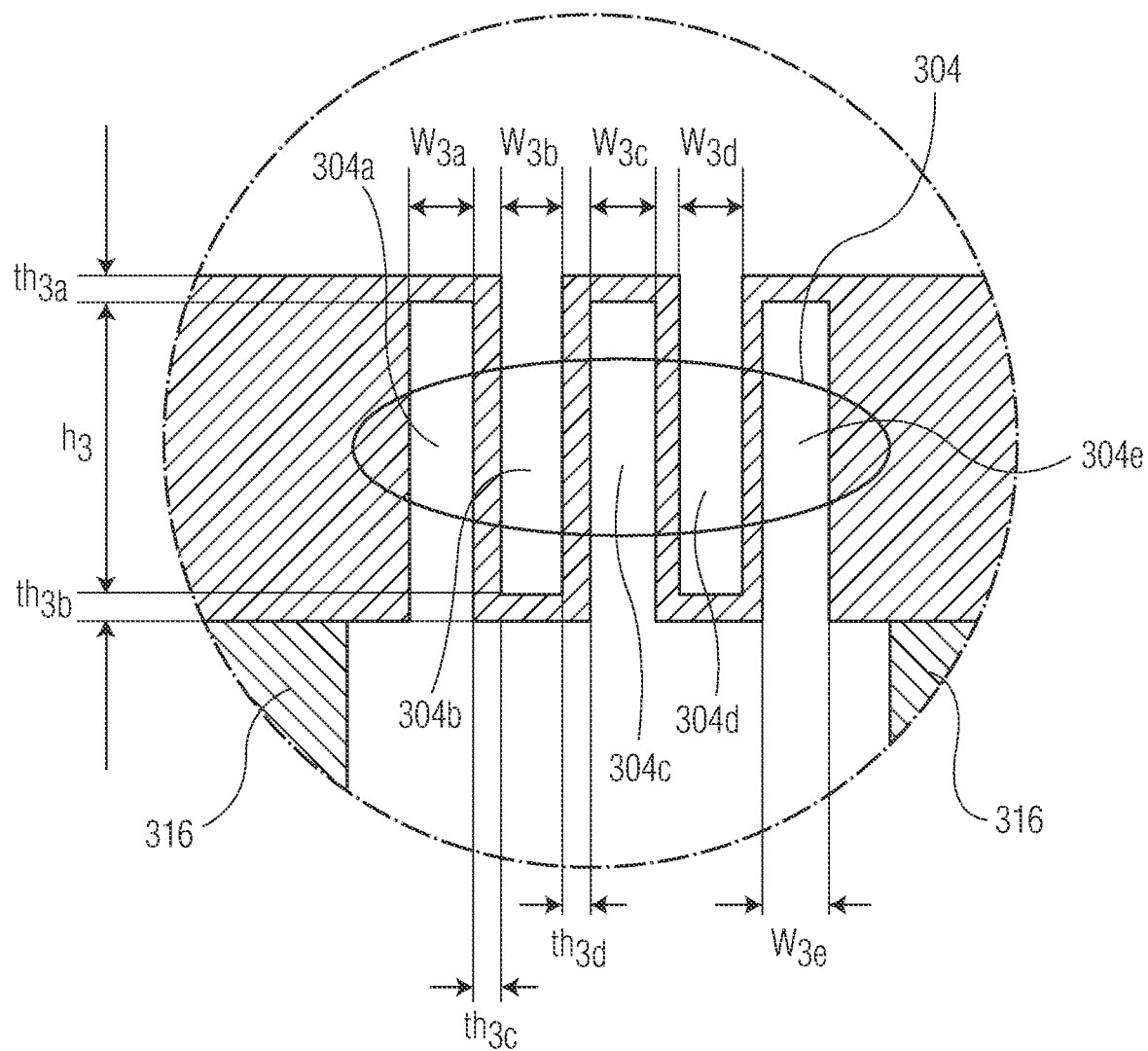
FIG. 3C is a detailed view of a groove of the oven of FIG. 3A.

Referring now to FIGS. 3A-3C, oven 300 is shown which is similar to oven 100 or oven 200 (where like elements have the same reference numerals, or a numeral beginning with a "3" instead of a "2" or "1"), except with a different groove configuration and having a single vacuum chamber 312a (as compared to oven 100). Oven 300 includes a cover (similar to cover 110 shown in FIG. 1B); however, it is omitted from the drawings for simplicity. Groove structure 304 is labelled in FIG. 3A (shown in detail in the cross-sectional view of FIG. 3C), and includes a subset of grooves (e.g., 304a, 304b, 304c, 304d, and 304e). This subset of grooves 304a, 304b, 304c, 304d, 304e is used to provide a stepped temperature profile between the plurality of temperature zones 301a, 301b, 301c, 301d, etc. (with controlled temperatures at each of the plurality of temperature zones, in a "stepped" configuration). Groove 304a has a width $W_{3a}$ and a height $h_3$; groove 304b has a width $W_{3b}$ and height $h_3$; grooves 304c, 304d, and 304e are similarly dimensioned. Grooves 304a, 304b, 304c, 304d, and 304e are defined by wall portions including an upper wall having a thickness $th_{3a}$, a lower wall having a thickness $th_{3b}$, and side walls having a thickness $th_{3c}$ or $th_{3d}$.

Figure 4A:
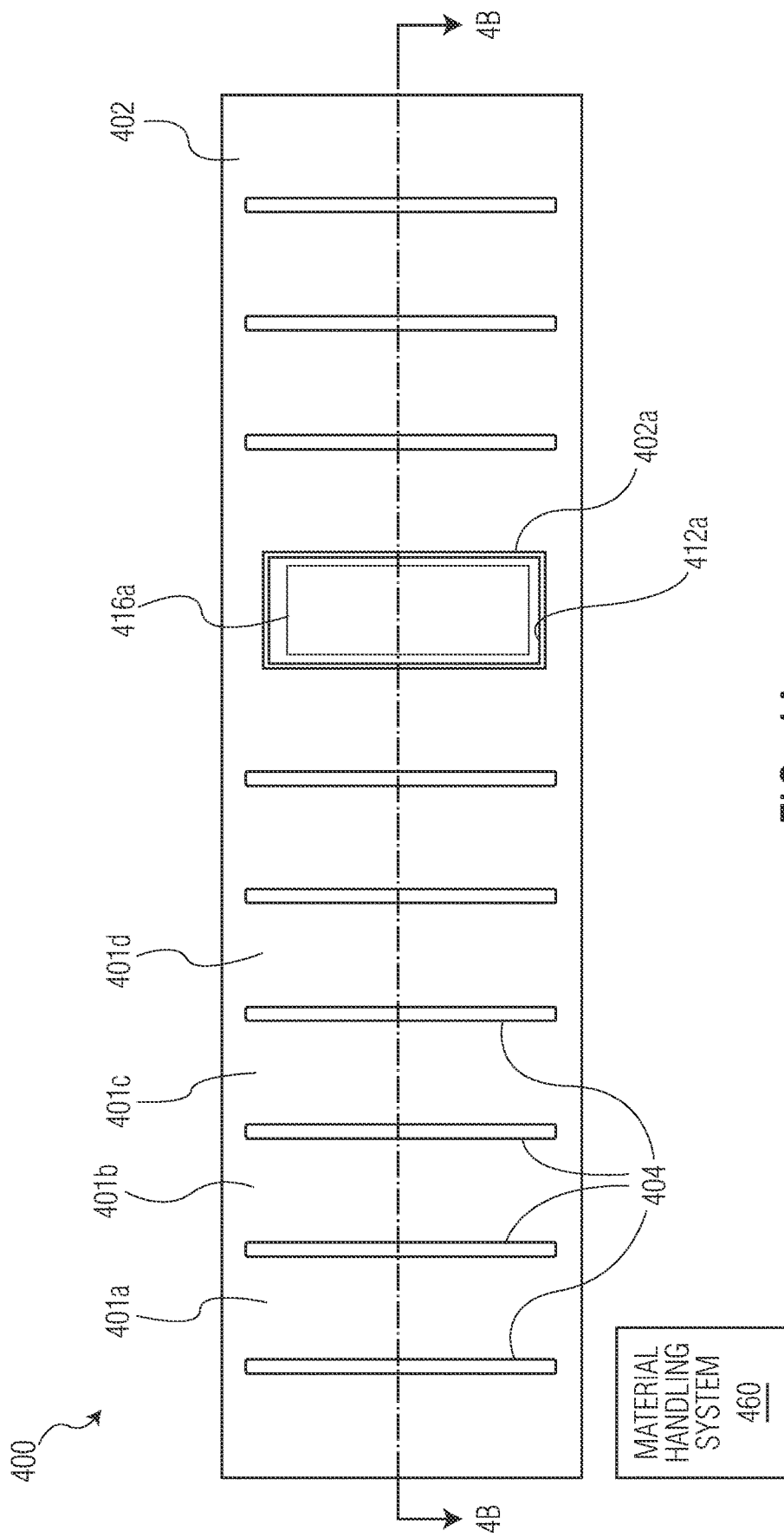
FIG. 4A is a block diagram top view of yet another oven in accordance with yet another exemplary embodiment of the invention.
Figure 4C:
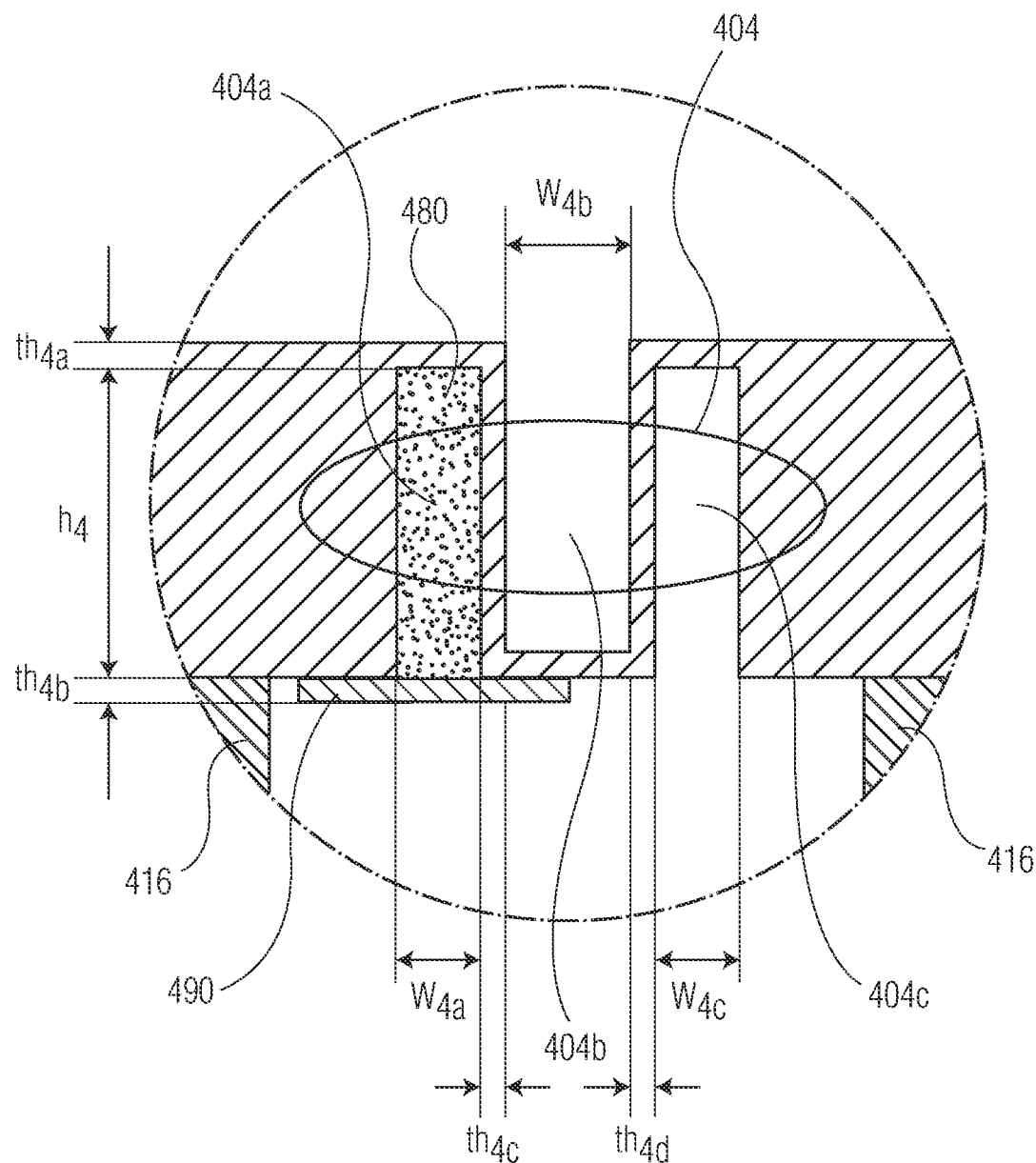
FIG. 4C is a detailed view of a groove of the oven of FIG. 4A.

Referring now to FIGS. 4A-4C, oven 400 is shown which is similar to oven 100, 200, or 300 (where like elements have the same reference numerals, or a numeral beginning with a "4" instead of a "3", "2", or "1"), except with a different groove configuration (see groove structure 404) including an active cooling fluid, and with a single vacuum chamber 412a (as compared to oven 100). Oven 400 includes a cover (similar to cover 110 shown in FIG. 1B); however, it is omitted from the drawings for simplicity. Groove structure 404 is labelled in FIG. 4A (shown in detail in the cross-sectional view of FIG. 4C), and includes a subset of grooves (e.g., 404a, 404b, and 404c). This subset of grooves 404a, 404b, and 404c is used to provide a stepped temperature profile between the plurality of temperature zones 401a, 401b, 401c, 401d, etc. (with controlled temperatures at each of the plurality of temperature zones, in a "stepped" configuration). Groove 404a has a width $W_{4a}$ and a height $h_4$; groove 404b has a width $W_{4b}$ and height $h_4$; and groove 304c has a width $W_4c$ and height $h_4$. Grooves 404a, 404b, and 404c are defined by wall portions including an upper wall having a thickness $th_{4a}$, a lower wall having a thickness $th_{4b}$, and side walls having a thickness $th_{4c}$ or $th_{4d}$. Groove 404a, which is closed off using structure 490, is shown with an active cooling fluid 480 provided therein. Active cooling fluid 480 (e.g., forced air, water, or other cooling fluids) may be provided in groove 404a selectively (or constantly) for use in providing the stepped temperature profile.

Figure 5A:
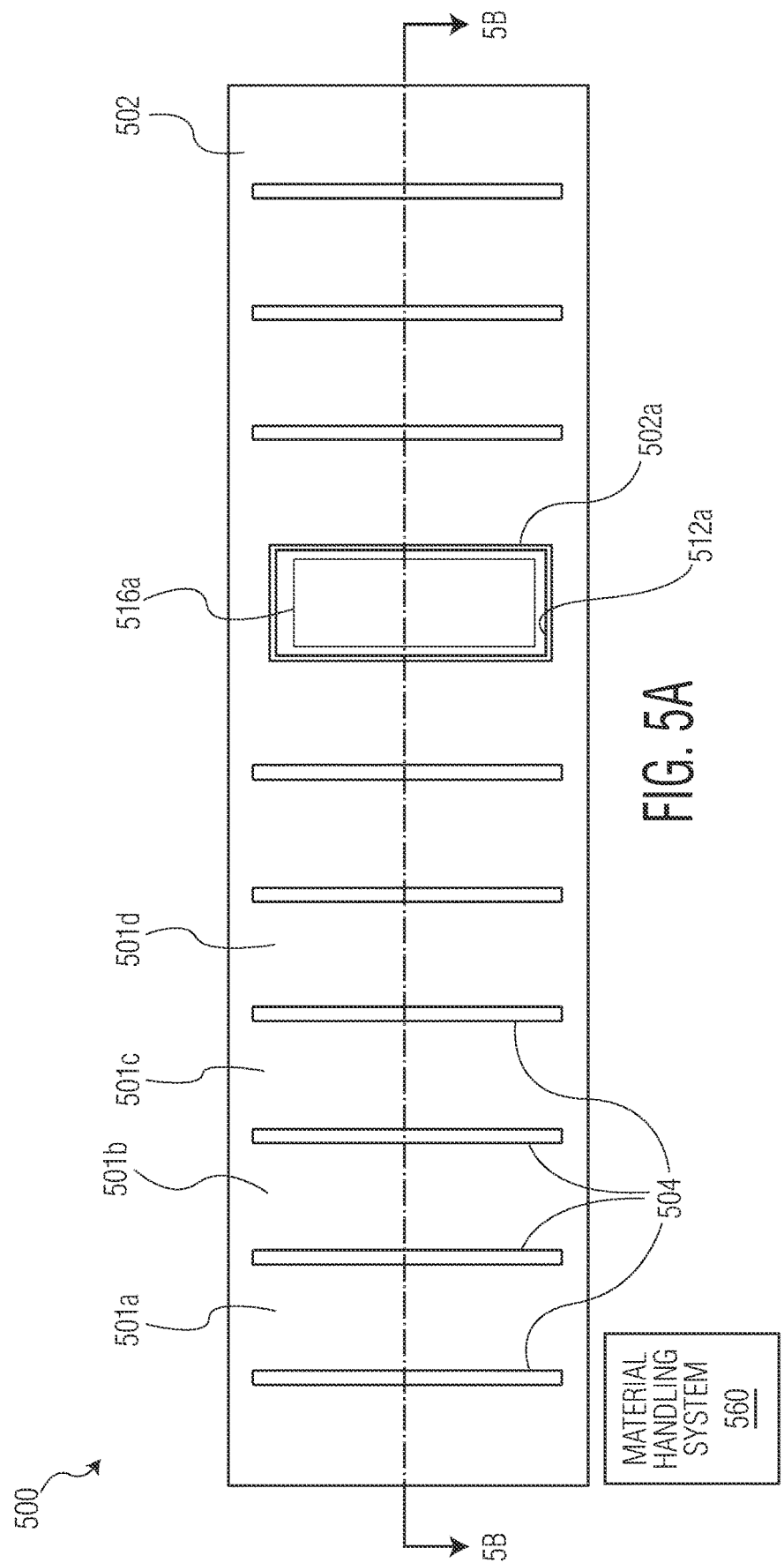
FIG. 5A is a block diagram top view of yet another oven in accordance with yet another exemplary embodiment of the invention.
Figure 5B:
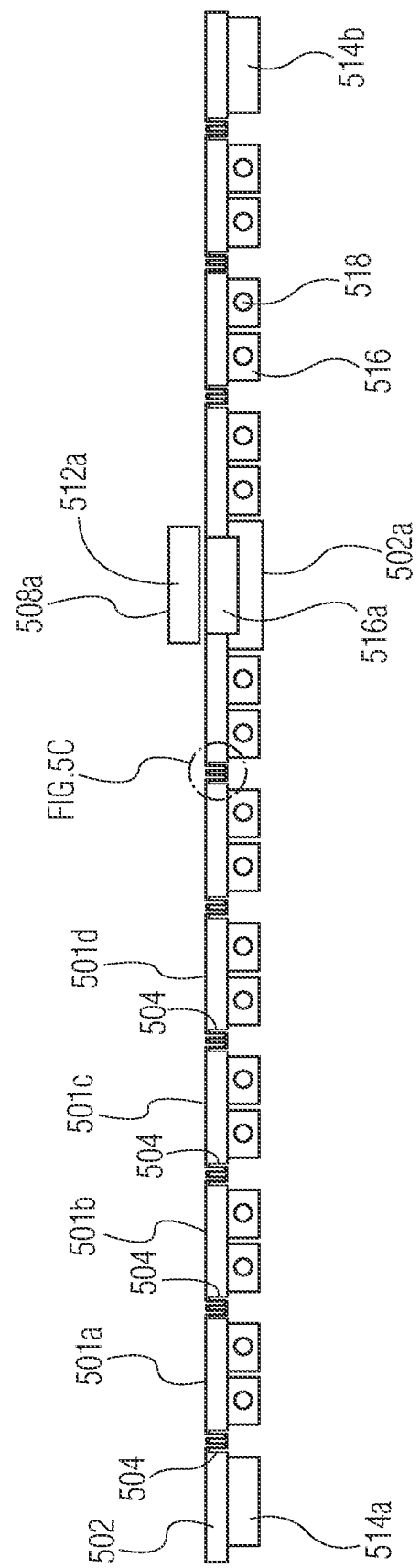
FIG. 5B is a block diagram side view of the oven of FIG. 5A.
Figure 5C:
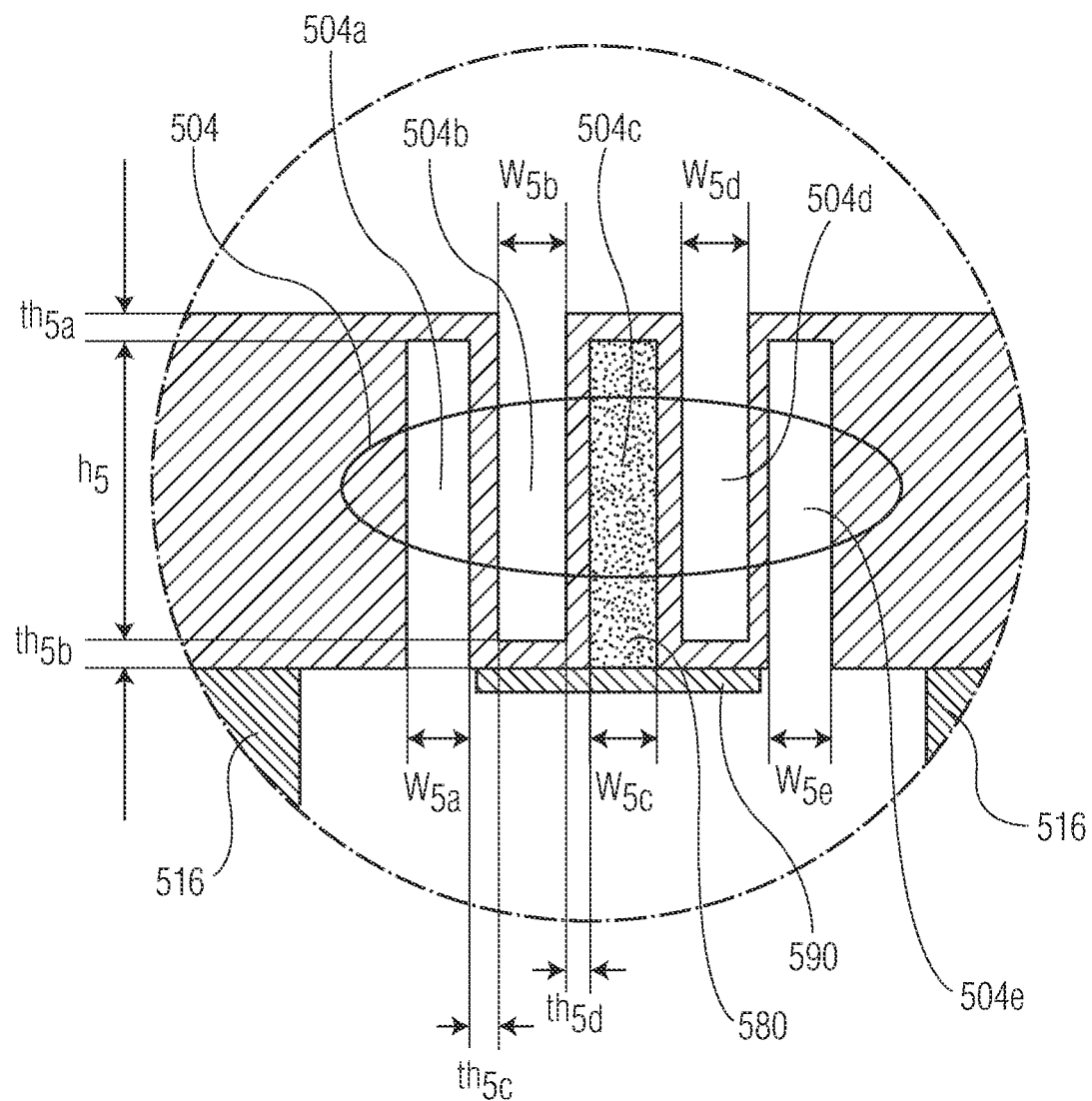
FIG. 5C is a detailed view of a groove of the oven of FIG. 5A.

Referring now to FIGS. 5A-5C, oven 500 is shown which is substantially similar to oven 100, 200, 300, 400 (where like elements have the same reference numerals, or a numeral beginning with a "5" instead of a "4", "3", "2", or "1"), except with a different groove configuration (see groove structure 504) with an active cooling fluid in the center groove 504c, and with a single vacuum chamber 512a (as compared to oven 100). Oven 500 includes a cover (similar to cover 110 shown in FIG. 1B); however, it is omitted from the drawings for simplicity. Groove structure 504 is labelled in FIG. 5A (shown in detail in the cross-sectional view of FIG. 5C), and includes a subset of grooves (e.g., 504a, 504b, 504c, 504d, and 504e). This subset of grooves 504a, 504b, 504c, 504d, and 504e is used to provide a stepped temperature profile between the plurality of temperature zones 501a, 501b, 501c, 501d, etc. (with controlled temperatures at each of the plurality of temperature zones, in a "stepped" configuration). Groove 504a has a width $W_{5a}$ and a height $h_5$; groove 504b has a width $W_{5b}$ and height $h_5$; groove 504c has a width $W_{5c}$ and a height $h_5$; and grooves 504d and 504e are similarly dimensioned. Grooves 504a, 504b, 504c, 504d, and 504e are defined by wall portions including an upper wall having a thickness $th_{5a}$, a lower wall having a thickness $th_{5b}$, and side walls having a thickness $th_{5c}$ or $th_{5d}$. Groove 504c, which is closed off using structure 590, is shown with an active cooling fluid 580 provided therein. Active cooling fluid 580 (e.g., e.g., forced air, water, or other cooling fluids) may be provided in groove 504c selectively (or constantly) for use in providing the stepped temperature profile.

Figure 6B:
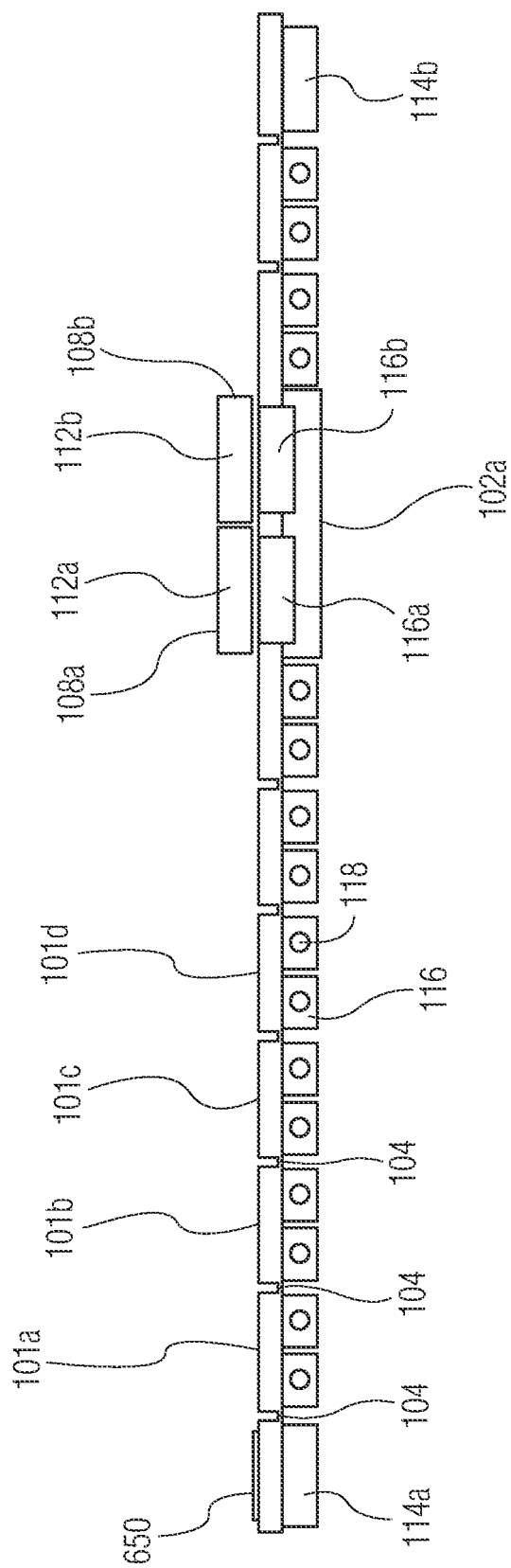
Figure 6C:
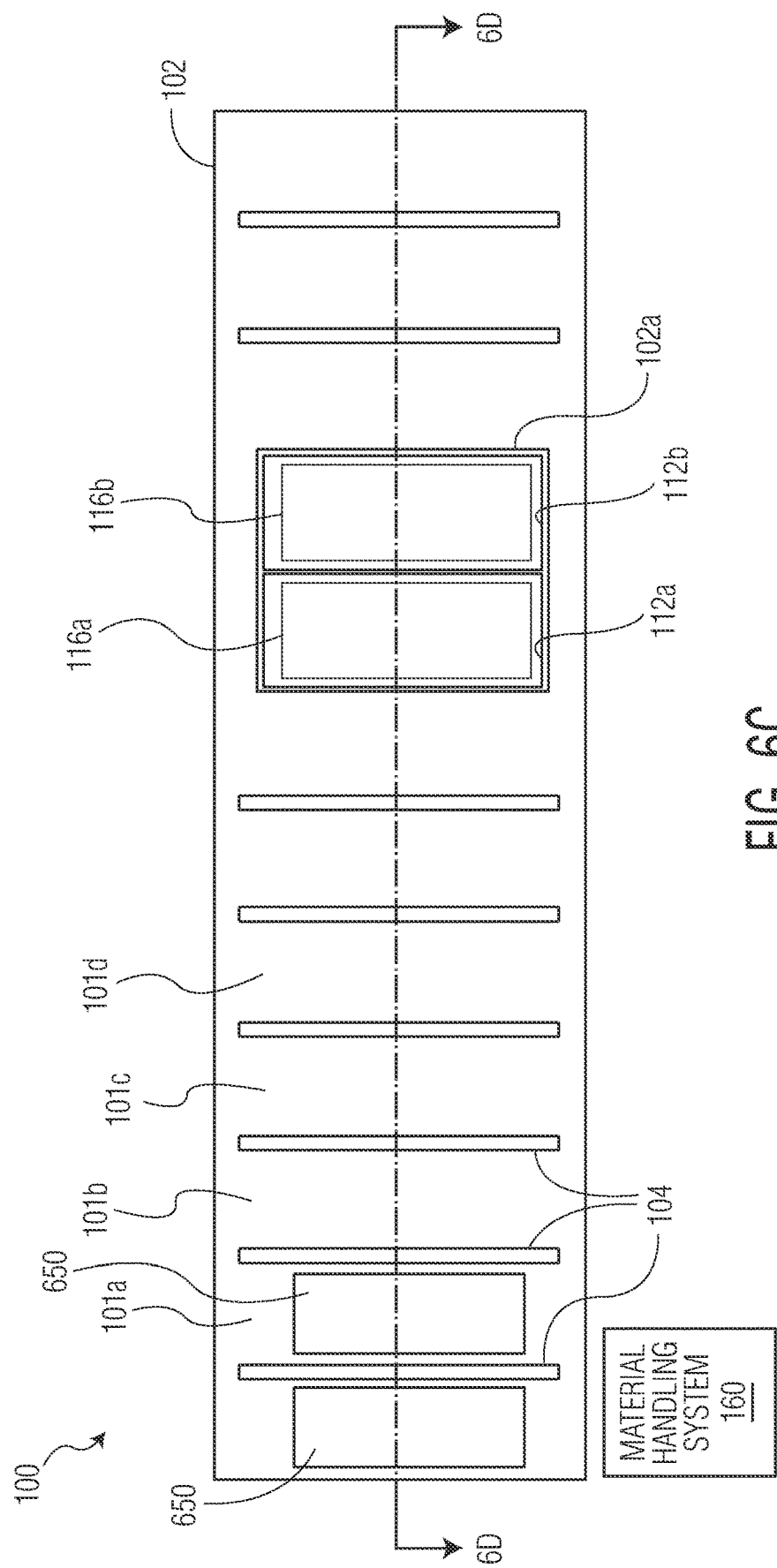
Figure 6D:
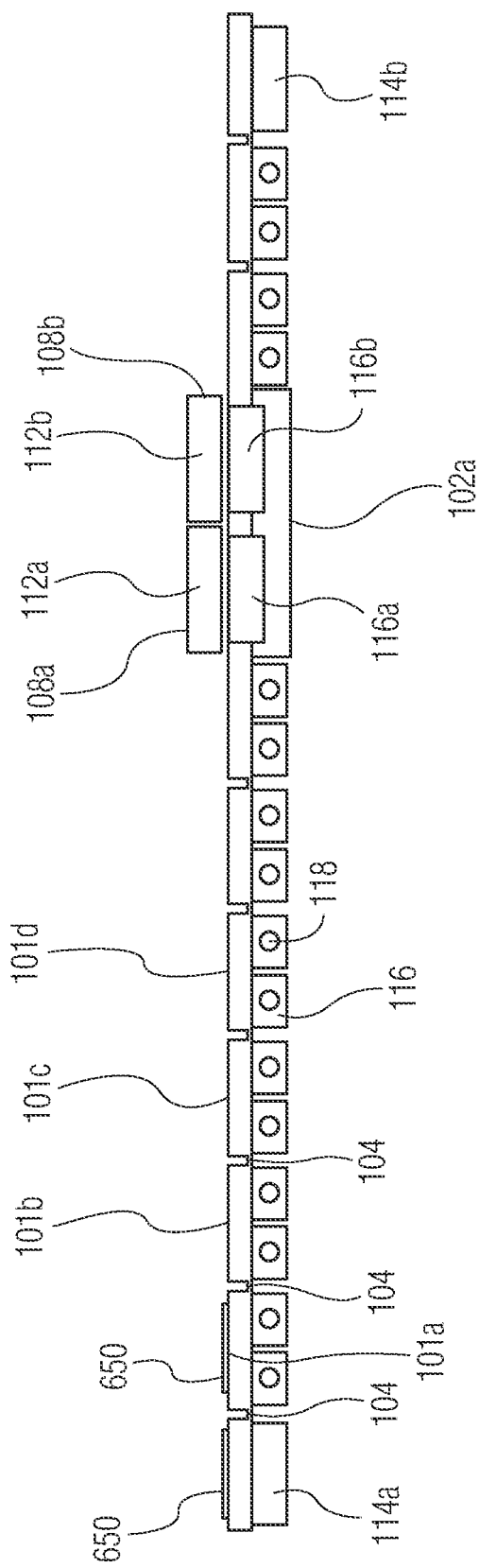
Figure 6F:
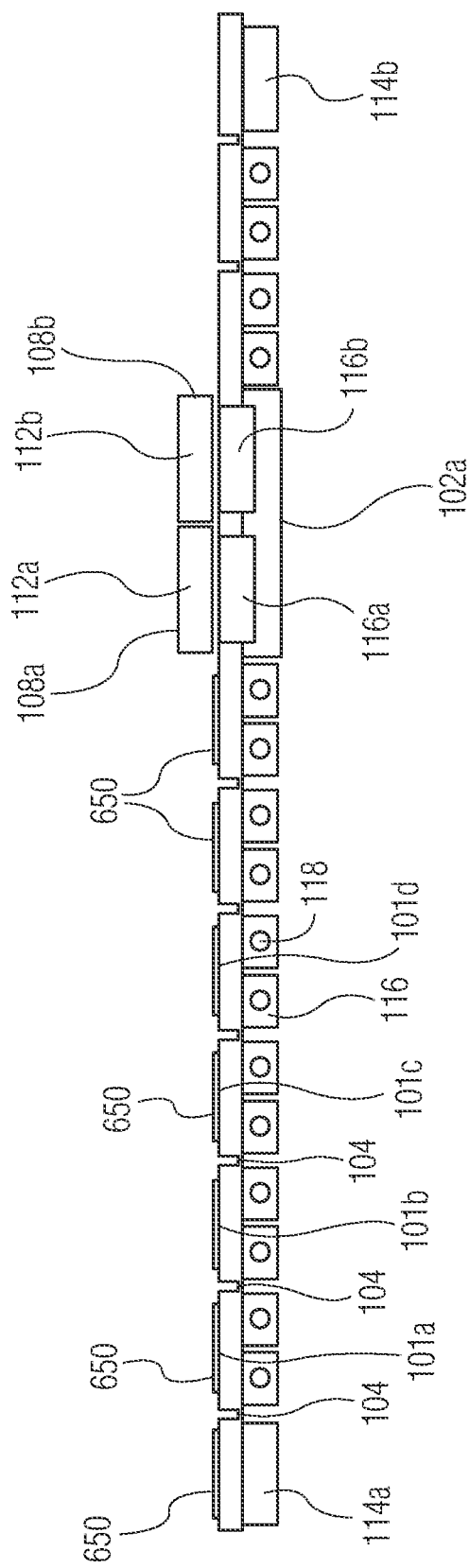
Figure 6H:
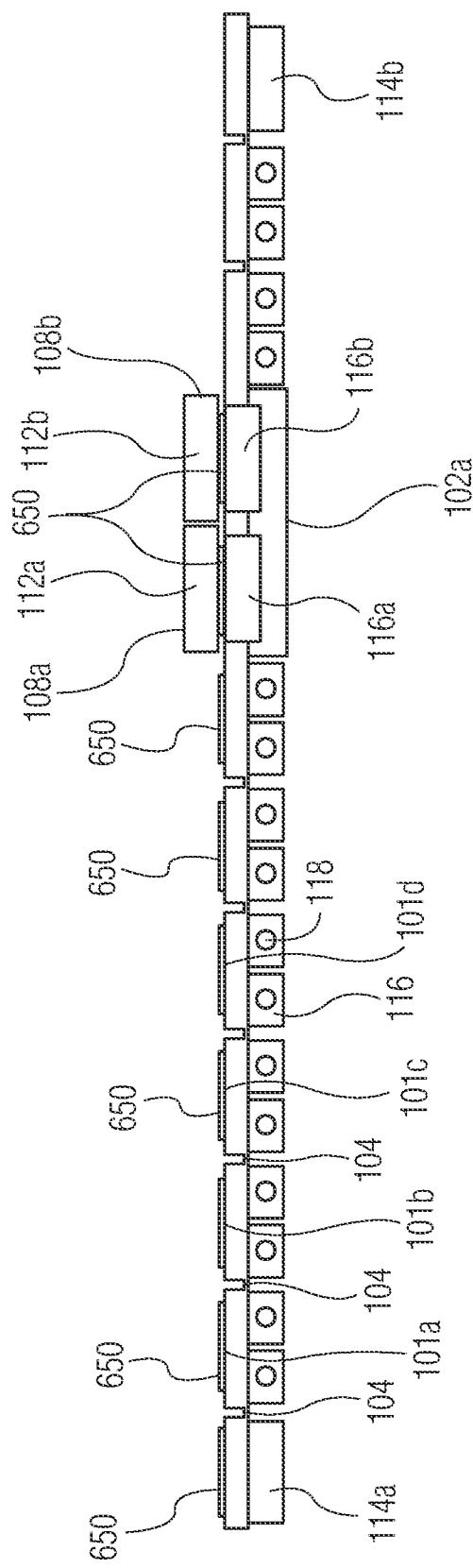

FIGS. 6A-6H illustrate a plurality of workpieces 650 being processed in connection with a conductive joint formation process within oven 100 (previously described in connection with FIGS. 1A-1D). As will be appreciated by those skilled in the art, details provided herein in connection with FIGS. 6A-6H may be applied to other ovens, such as, for example, oven 200 shown in FIGS. 2A-2C, oven 300 shown in FIGS. 3A-3C, oven 400 shown in FIGS. 4A-4C, oven 500 shown in FIGS. 5A-5C, and any other oven within the scope of the invention. FIGS. 6A-6B illustrate a first workpiece 650, having a width W and a length L, at an initial position above entrance cooling block 114a. FIGS. 6C-6D illustrate the first workpiece 650 having been moved along oven plate 102 (e.g., using material handling system 160) to temperature zone 101a, and a second workpiece 650 at the initial position. FIGS. 6E-6F illustrate a plurality of workpieces 650 having been moved into oven 100, with the first workpiece 650 having been moved along oven plate 102 prior to entering vacuum chamber 112a). FIGS. 6G-6H illustrate a plurality of workpieces 650, with the first workpiece 650 having been moved along oven plate 102 (and vacuum insert 102a) to a position within vacuum chamber 112b, and with the second workpiece 650 having been moved to a position within vacuum chambers 112a.

Figure 7A:
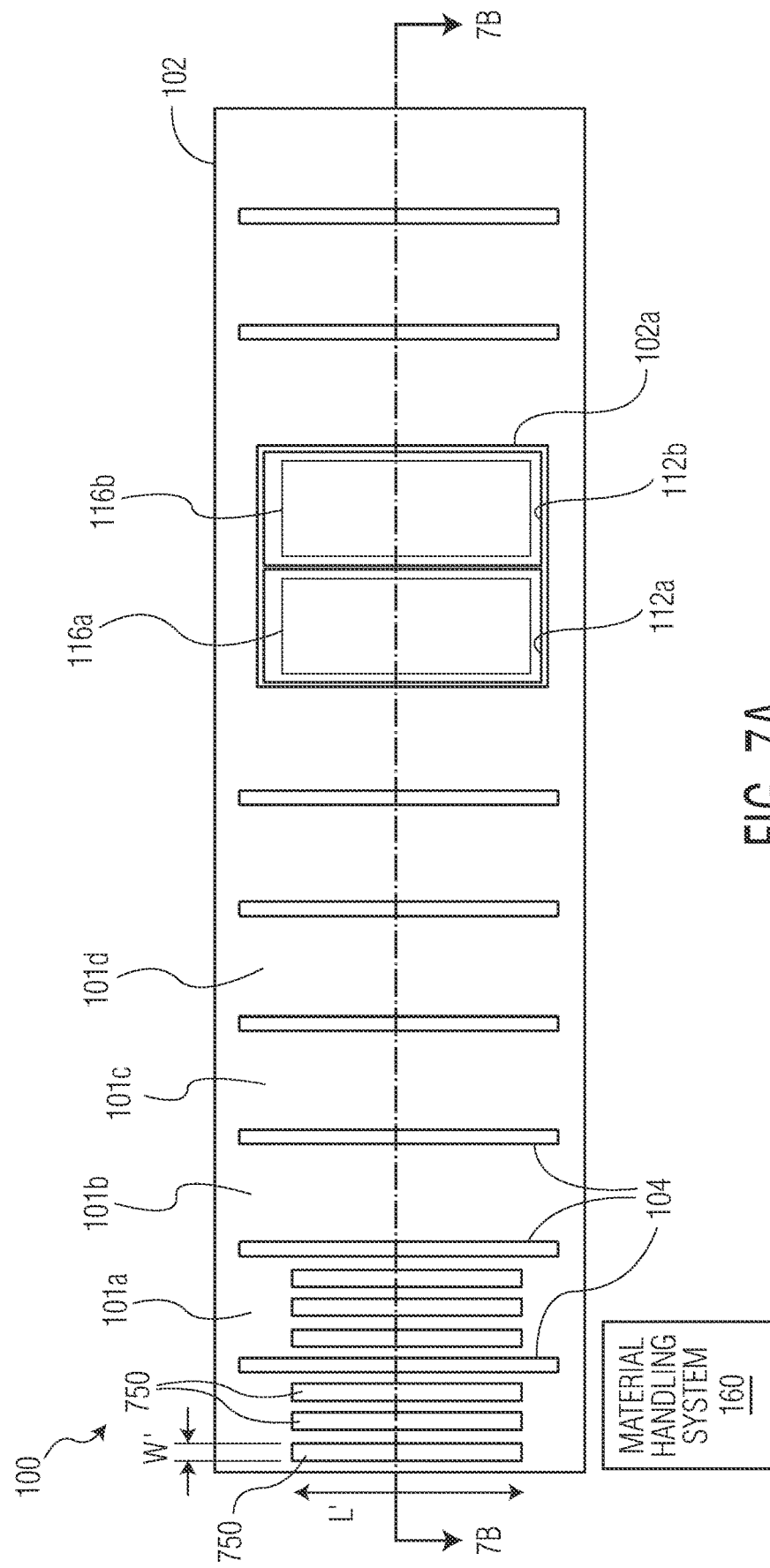
FIGS. 7A-7D are a series of top and side block diagram views of the oven of FIG. 1A, illustrating another method of operating the oven, in accordance with another exemplary embodiment of the invention.
Figure 7B:
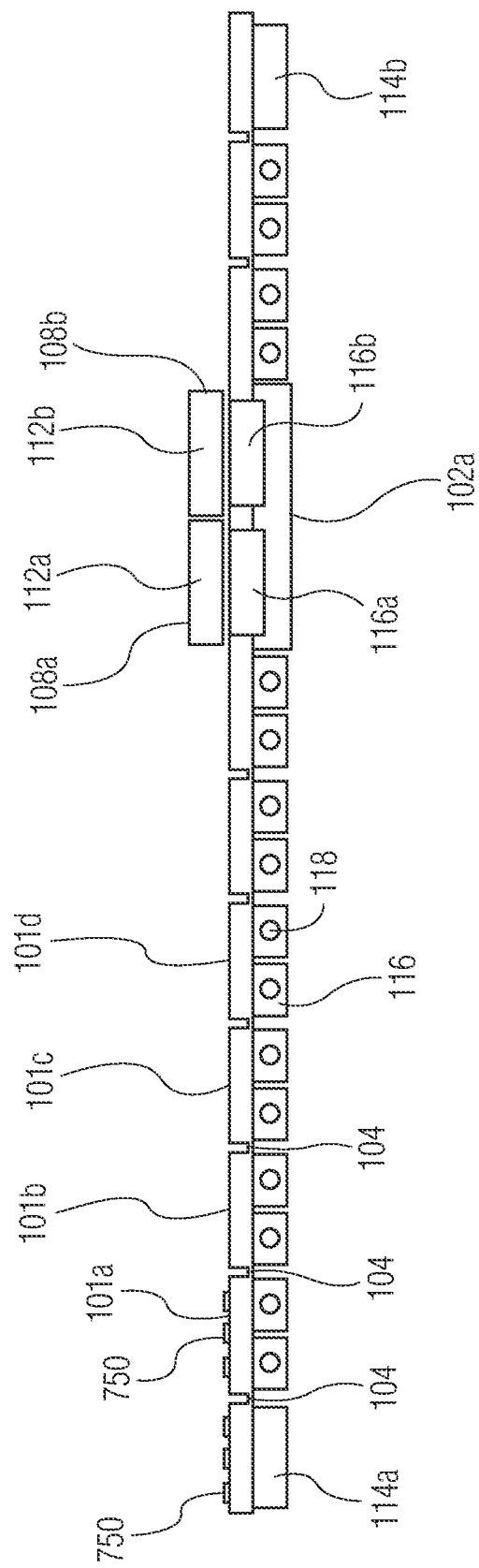
Figure 7C:
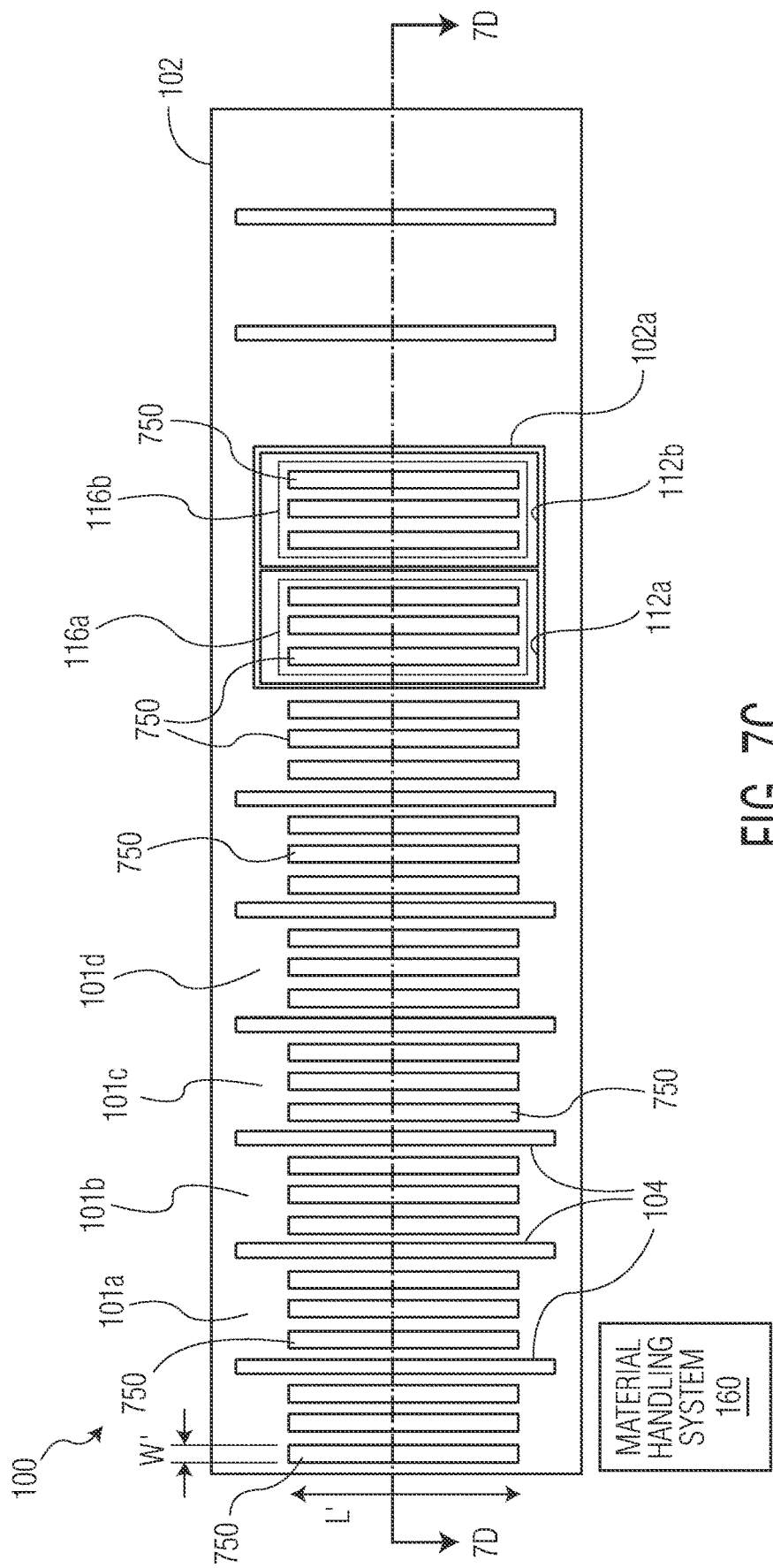
Figure 7D:
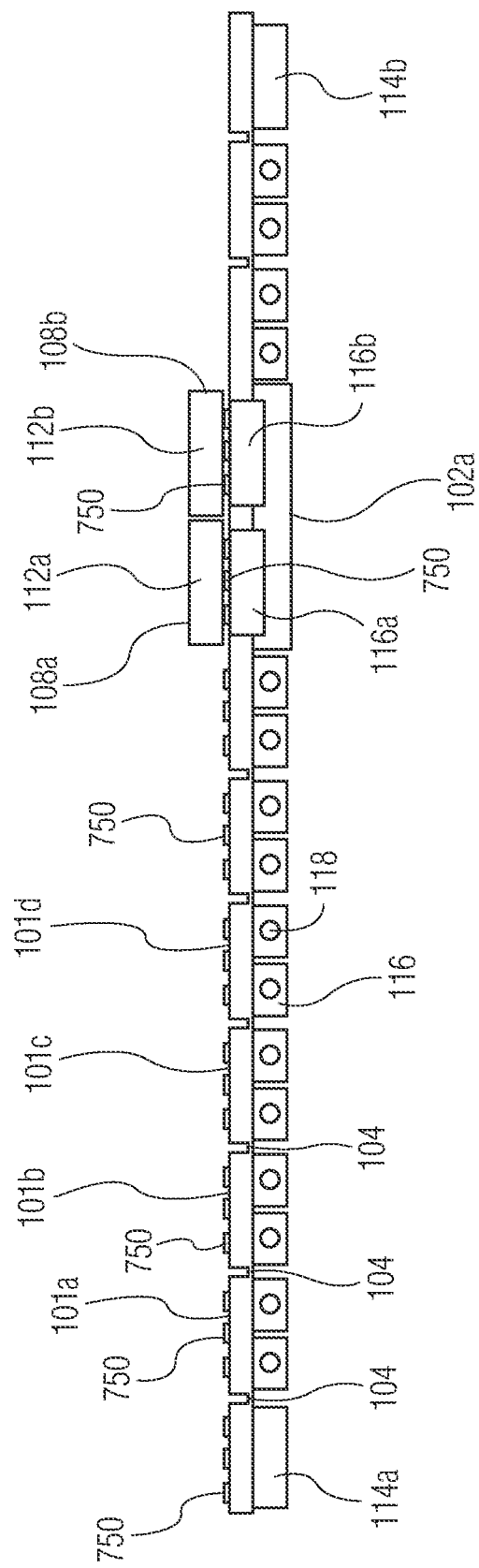

FIGS. 7A-7D illustrate a plurality of workpieces 750 being processed in connection with a conductive joint formation process within oven 100 (previously described in connection with FIGS. 1A-1D). As will be appreciated by those skilled in the art, details provided herein in connection with FIGS. 7A-7D may be applied to other ovens, such as, for example, oven 200 shown in FIGS. 2A-2C, oven 300 shown in FIGS. 3A-3C, oven 400 shown in FIGS. 4A-4C, oven 500 shown in FIGS. 5A-5C, and any other oven within the scope of the invention. FIGS. 7A-7B illustrate a first and second group of workpieces 750 (i.e., a group contains three workpieces), each workpiece having a respective width W' and a length L'. FIGS. 7A-7B illustrate the second group of workpieces 750 at an initial position above entrance cooling block 114a and the first group of workpieces 750 having been moved along oven plate 102 (e.g., using material handling system 160) to temperature zone 101a. FIGS. 7C-7D illustrate a plurality of groups of workpieces 750 having been moved into oven 100, with the first group of workpieces having been moved along oven plate 102 (and vacuum insert 102a) to a position within vacuum chamber 112b, and with the second group of workpieces having been moved to a position within vacuum chambers 112a.

Thus, FIGS. 1A-1D, FIGS. 2A-2C, FIGS. 3A-3C, FIGS. 4A-4C, FIGS. 5A-5C, FIGS. 6A-6H, and FIGS. 7A-7D, have been described in connection with various ovens within the scope of the invention. Such ovens (e.g., oven 100, oven 200, oven 300, oven 400, oven 500, and any other oven within the scope of the invention) may be used in connection with various types of machines or systems. Examples of such machines/systems include die attach systems, flip chip bonding systems, clip attach systems, combinations of the foregoing, among others. FIGS. 8-12 illustrate a workpiece input handler 824, an oven 800, and an output workpiece handler 834. These example elements are like elements throughout each of FIGS. 8-12. Oven 800 may be, for example, oven 100 (from FIGS. 1A-1D), oven 200 (from FIGS. 2A-2C), oven 300 (from FIGS. 3A-3C), oven 400 (from FIGS. 4A-4C), oven 500 (from FIGS. 5A-5C), and any other oven within the scope of the invention.

Referring now to FIG. 8, a die attach system 801 is shown. Die attach system 801 includes: workpiece input handler 824, die bonder 820, oven 800, and workpiece output handler 834. Die bonder 820 includes: a die source 830 including a plurality of die 832; a support structure 822 (including a material handling system) for supporting a workpiece 850; a dispensing unit 826 for dispensing an attachment material 836 on workpiece 850; and a placement system 828 for transferring at least one of the plurality of die 832 from die source 830 to workpiece 850. Further, die attach system 801 includes a workpiece input handler 824 that provides a workpiece 850. The material handling system of support structure 822 (sometimes referred to as substrate transport or handler) transports workpiece 850 through die bonder 820. Dispensing unit 826 provides an attachment material 836 onto workpiece 850. Die placement system 828 transports a die 832 from die source 830 to workpiece 850 at the areas where attachment material 836 is located. Material handling system of support structure 822 transports workpiece 850 to oven 800. Workpiece 850 is transported through oven chamber 803. Finished workpiece 850 is removed from oven 800 by workpiece output handler 834.

Refering now to FIG. 9, a flip chip bonding system 901 is shown. Flip chip bonding system 901 is similar in some ways to die attach system 801 of FIG. 8 (where like elements have the same reference numerals, or a numeral beginning with a '9' instead of an '8'). However, flip chip bonding system 901 includes flip chip bonder 920 (as opposed to die bonder 820 shown in FIG. 8). Flip chip bonder 920 includes a die source 930 (including a plurality of die 932), a dispensing unit 926 (for dispensing a material 936, such as a solder material, onto workpiece 850), a flip chip placement system 928, and a flipper 938, as shown. Flipper 938 is used to flip die 932 (or another semiconductor element) to position electrically conductive structures on die 932 to be bonded to electrically conductive structures on workpiece 850.

Referring now to FIG. 10, a clip attach system 1001 is shown. Clip attach system 1001 is similar in certain ways to die attach system 801 of FIG. 8 (where like elements have the same reference numerals, or a numeral beginning with a "10" instead of an "8"). However, clip attach system 1001 includes clip bonder 1040 (as opposed to die bonder 820 shown in FIG. 8). Clip bonder 1040 includes dispensing unit 1026 (for dispensing a material 1036, such as a solder material, onto workpiece 850), clip placement system 1042, and clip input supply 1044 (e.g., reel plus stamping unit, bowl feeder, etc.). Material handling system of support structure 1022 (sometimes referred to as substrate transport or handler) transports workpiece 850 through clip bonder 1040. Dispensing unit 1026 provides material 1036 onto workpiece 850. Clip placement system 1042 transports a clip 1052 from clip input supply 1044 to workpiece 850 at the areas where material 1036 is located. Material handling system of support structure 1022 transports workpiece 850 to oven 800 for bonding. Workpiece 850 is transported through oven chamber 803 to undergo bonding. Finished workpiece 850 is removed from oven 800 by substrate output handler 834.

Figure 11:
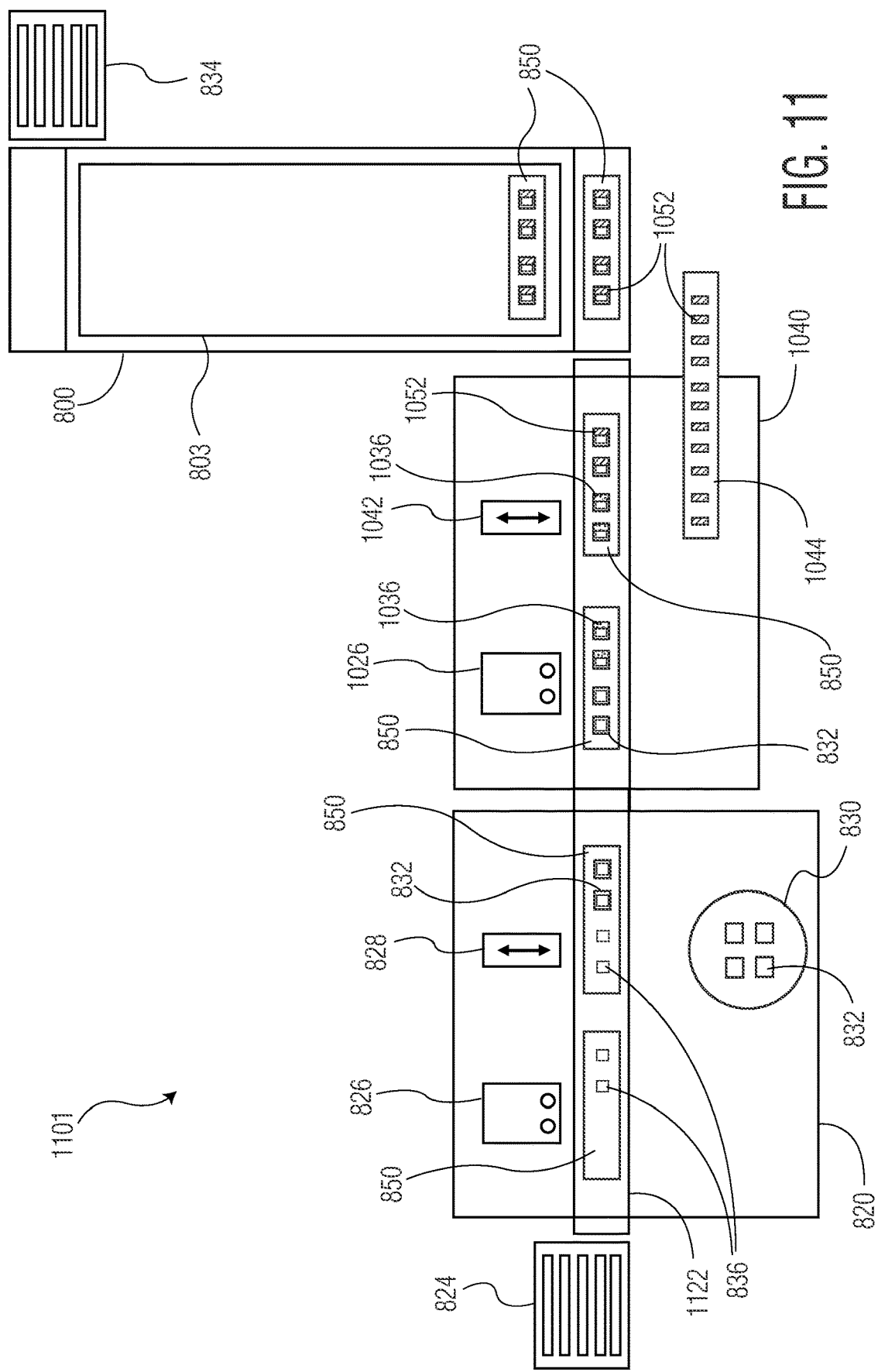
FIG. 11 is a block diagram illustration of another clip attach system, in accordance with an exemplary embodiment of the invention.

Refering now to FIG. 11, a clip attach system 1101 is shown. Clip attach system 1101 is substantialy similar to clip attach system 1001 described in connection with FIG. 10 (where like elements have the same reference numerals, or a numeral beginning with a '11' instead of an '8' or '10'). However, clip attach system 1101 also includes die bonder 820 previously described in connection with FIG. 8. FIG. 11 illustrates a plurality of workpieces 850 provided at different positions through a die attach process (primarily by die bonder 820), a clip attach process (primarily by clip bonder 1040), and entering into a conductive structure formation process (provided by oven 800). In a first position on the left side of die bonder 820, a workpiece 850 is illustrated with attachment material 836 having been placed at two locations on workpiece 850 by dispensing unit 826. In a second position on the right side of die bonder 820, a workpiece 850 is illustrated with attachment material 836 having been placed at four different locations of workpiece 850, and two die 832 having been placed (on attachment material 836) on two locations on workpiece 850 by die placement system 828 (where the die 832 are obtained from die source 830). In a third position on the left side of clip bonder 1040, a workpiece 850 is illustrated with attachment material 836 having been placed at four locations on workpiece 850, and with four die 832 having been placed on workpiece 850. In the third position, workpiece 850 is illustrated with material 1036 having been placed at two locations by dispensing unit 1026. In a fourth position on the right side of clip bonder 1040, a workpiece 850 is illustrated with attachment material 836 having been placed at four locations on workpiece 850, and with four die 832 having been placed on workpiece 850, and with material 1036 having been placed at four locations on workpiece 850, and with two clips 1052 (from clip input supply 1044) having been placed on material 1036 at two locations on workpiece 850 using clip placement system 1042. In a fifth position, a workpiece 850 is illustrated prior to entering oven 800 for conductive structure joint formation. In a sixth position, a workpiece 850 is illustrated within oven chamber 803 for conductive structure joint formation.

Figure 12:
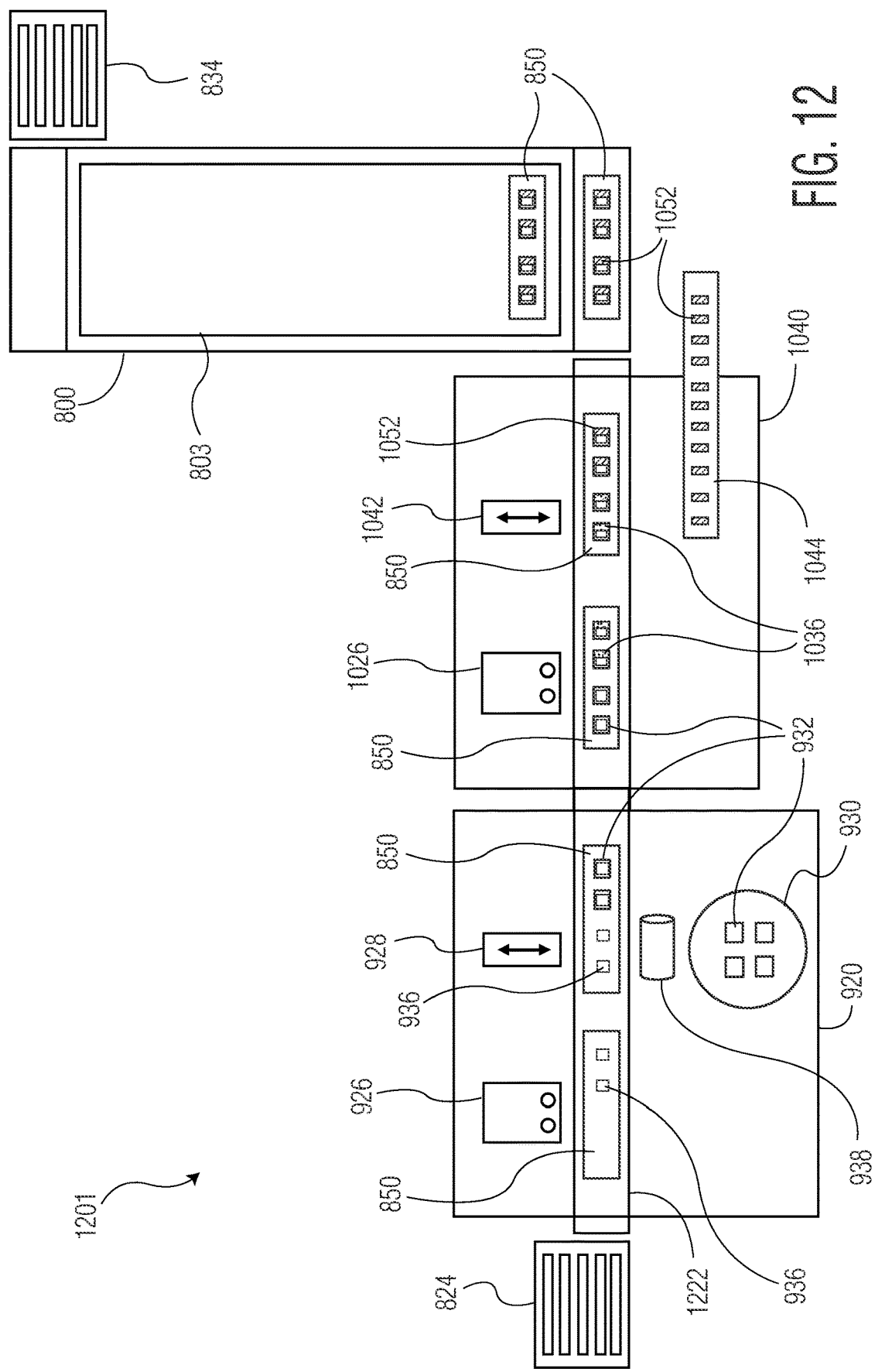
FIG. 12 is a block diagram illustration of yet another clip attach system, in accordance with an exemplary embodiment of the invention.

Refering now to FIG. 12, a clip attach system 1201 is shown. Clip attach system 1201 is substantialy similar to clip attach system 1001 described in connection with FIG. 10 (where like elements have the same reference numerals, or a numeral beginning with a '12' instead of an '8,' '9' or '10'). However, clip attach system 1201 also includes flip chip bonder 920 previously described in connection with FIG. 9. FIG. 12 illustrates a plurality of workpieces 850 provided at different positions through a flip chip bonding process (primarily by flip chip bonder 920), a clip attach process (primarily by clip bonder 1040), and entering into a conductive structure formation process (provided by oven 800). In a first position on the left side of flip chip bonder 920, a workpiece 850 is illustrated with material 936 having been placed at two locations on workpiece 850 by dispensing unit 926. In a second position on the right side of flip chip bonder 920, a workpiece 850 is illustrated with material 936 having been placed at four different locations of workpiece 850, and two die 932 having been placed (on material 936) on two locations on workpiece 850 by flip chip placement system 928 (where the die 932 are obtained from die source 930). In a third position on the left side of clip bonder 1040, a workpiece 850 is illustrated with material 936 having been placed at four locations on workpiece 850, and with four die 932 having been placed on workpiece 850. In the third position, workpiece 850 is illustrated with material 1036 having been placed at two locations by dispensing unit 1026. In a fourth position on the right side of clip bonder 1040, a workpiece 850 is illustrated with material 1036 having been placed at four locations on workpiece 850, and with four die 932 having been placed on workpiece 850, and with material 1036 having been placed at four locations on workpiece 850, and with two clips 1052 (from clip input supply 1044) having been placed on material 1036 at two locations on workpiece 850 using clip placement system 1042. In a fifth position, a workpiece 850 is illustrated prior to entering oven 800 for conductive structure joint formation. In a sixth position, a workpiece 850 is illustrated within oven chamber 803 for conductive structure joint formation.

While FIG. 12 does not include a die bonder such as die bonder 820 shown in FIG. 8 and FIG. 11, it is understood that such a die bonder could be integrated into clip attach system 1201 (e.g., upstream or downstream of flip chip bonder 920). Thus, any combination of die bonders, flip chip bonders, and clip bonders may be integrated into a single clip attach system (or other systems) within the scope of the invention. More specifically, multiple die types may be integrated into a single workpiece. Thus, a clip attach system (or die attach system, or flip chip bonding system, or other systems within the scope of the invention) may include multiple bonders of varying types as desired in a given application.

Although aspects of the invention described herein relate to an oven including an oven plate formed from a unitary piece of material, it is not limited thereto. The various oven plates described herein may be formed from a unitary piece of material, or may be formed of a plurality of pieces of material. For example, if the oven plate is formed of a plurality of pieces of material, each of the plurality of pieces of material may be separated from adjacent ones of the plurality of pieces of material by an air gap. In another example, if the oven plate is formed of a plurality of pieces of material, a low thermally conductive material may be provided between each of the plurality of pieces of material.

Although aspects of the invention described herein relate to certain groove configurations (e.g., having a single groove or multiple grooves) (e.g., grooves with certain widths, heights, wall thicknesses, etc.) (e.g., grooves with active cooling and without active cooling), such configurations are exemplary in nature, and the invention is not limited thereto. Any detail of such grooves can be varied within the scope of the invention. For example, an oven plate may have some groove structures that are single grooves (e.g., such as grooves 104 described in connection FIGS. 1A-1D), and others with multiple grooves (e.g., a subset of grooves such as groove structures 404 described in connection with FIGS. 4A-4C), selectively positioned as desired along the length of the oven plate. In another example, the widths, heights, and wall thicknesses of a groove structure may vary; that is, in a single groove structure the widths, heights, and wall thicknesses related to each groove may vary from one another. In yet another example, grooves with active cooling (and without active cooling) may be arranged as desired in a single groove structure (with multiple grooves), and/or as desired along the length of the oven plate. Thus, it is clear that the details of the grooves (and groove structures) illustrated herein are exemplary in nature.

In a specific detailed example, an oven plate within the scope of the invention (and applicable to any oven described herein) may include: a groove structure having multiple grooves (such as groove structure 404 or 504, or any other groove structure having multiple grooves) on each end of the oven plate; and single grooves (such as grooves 104 described in connection with FIGS. 1A-1D) along the length of the oven plate, but between the groove structures with multiple grooves positioned at each end of the oven plate.

Although the invention is illustrated and described herein with reference to specific embodiments, the invention is not intended to be limited to the details shown. Rather, various modifications may be made in the details within the scope and range of equivalents of the claims without departing from the invention.

What is claimed:

1. An oven for assisting in conductive joint formation related to a workpiece, the oven comprising:
   a chamber, the chamber being at least partially defined by (i) an oven plate and (ii) a cover, the oven plate defining a plurality of grooves;
   a material handling system for moving the workpiece through the oven in connection with a conductive joint formation process;
   a plurality of heater elements; and
   at least one vacuum chamber within the chamber,
   wherein the oven provides a stepped temperature profile including a plurality of temperature zones along the oven plate, at least one of the plurality of grooves separating adjacent ones of the plurality of temperature zones along the oven plate, the plurality of heater elements controlling a temperature in the plurality of temperature zones.

2. The oven of claim 1 wherein the workpiece includes (i) a plurality of die, (ii) a substrate, and (iii) a plurality of conductive clips configured to provide conductive coupling between ones of the plurality of die and the substrate using a solder reflow process in the oven.

3. The oven of claim 1 wherein the workpiece includes (i) a plurality of die, and (ii) a plurality of conductive clips configured to be conductively coupled to respective ones of the plurality of die using a solder reflow process in the oven.

4. The oven of claim 1 wherein the workpiece includes (i) a die, and (ii) a substrate, and (iii) at least one conductive clip configured to provide conductive coupling between the die and the substrate using a solder reflow process in the oven.

5. The oven of claim 1 wherein the workpiece includes (i) a die, and (ii) at least one conductive clip configured to be conductively coupled to the die using a solder reflow process in the oven.

6. The oven of claim 1 wherein the workpiece includes a plurality of die and a substrate, the plurality of die being configured to be conductively coupled to the substrate using a solder reflow process in the oven.

7. The oven of claim 1 wherein the workpiece includes a die and a substrate, the die being configured to be conductively coupled to the substrate using solder reflow in the oven.

8. The oven of claim 1 wherein the stepped temperature profile is configured to be customized for a given application to provide a desired stepped temperature profile.

9. The oven of claim 1 wherein the oven is configured to provide a substantially uniform temperature within each of the plurality of temperature zones.

10. The oven of claim 1 wherein the plurality of heater elements are distributed beneath the oven plate, and are disposed between ones of the plurality of grooves.

11. The oven of claim 1 wherein a single one of the plurality of grooves is defined between each of the plurality of temperature zones along the oven plate.

12. The oven of claim 1 wherein a subset of the plurality of grooves is defined between each of the plurality of temperature zones along the oven plate, the subset including more than one groove.

13. The oven of claim 12 wherein at least one groove of the subset is provided with an active cooling fluid.

14. The oven of claim 13 wherein another at least one groove of the subset does not include the active cooling fluid.

15. The oven of claim 1 wherein the plurality of heater elements includes at least two heater elements provided for each of the plurality of temperature zones, the at least two heater elements being separately controllable.

16. The oven of claim 1 wherein the conductive joint formation process provided in the oven in connection with the workpiece includes at least one of a sintered coupling process and a soldered coupling process.

17. The oven of claim 1 wherein the conductive joint formation process provided in the oven in connection with the workpiece includes a solder reflow coupling process.

18. The oven of claim 1 wherein the oven plate is formed from a unitary piece of material.

19. The oven of claim 1 wherein the oven plate is formed of a plurality of pieces of material.

20. A die attach system comprising:
a die source including a plurality of die;
a support structure for supporting a workpiece;
a placement system for transferring at least one of the plurality of die from the die source to the workpiece; and
an oven for assisting in conductive joint formation related to the workpiece after placement of the at least one of the plurality of die using the placement system, the oven including (a) a chamber, the chamber being at least partially defined by (i) an oven plate and (ii) a cover, (b) a material handling system for moving the workpiece through the oven in connection with a conductive joint formation process, (c) at least one vacuum chamber within the chamber, wherein the oven provides a stepped temperature profile including a plurality of temperature zones along the oven plate, and (d) a plurality of heater elements,
the oven plate defining a plurality of grooves, at least one of the plurality of grooves separating adjacent ones of the plurality of temperature zones along the oven plate, the plurality of heater elements controlling a temperature in the plurality of temperature zones.

21. A flip chip bonding system comprising:
a die source including a plurality of die;
a support structure for supporting a workpiece;
a flip chip placement system for transferring at least one of the plurality of die from the die source to the workpiece; and
an oven for assisting in conductive joint formation related to the workpiece after placement of the at least one of the plurality of die using the flip chip placement system, the oven including (a) a chamber, the chamber being at least partially defined by (i) an oven plate and (ii) a cover, (b) a material handling system for moving the workpiece through the oven in connection with a conductive joint formation process, (c) at least one vacuum chamber within the chamber, wherein the oven provides a stepped temperature profile including a plurality of temperature zones along the oven plate, and (d) a plurality of heater elements,
the oven plate defining a plurality of grooves, at least one of the plurality of grooves separating adjacent ones of the plurality of temperature zones along the oven plate, the plurality of heater elements controlling a temperature in the plurality of temperature zones.

22. A clip attach system comprising:
a clip source including a plurality of conductive clips;
a support structure for supporting a workpiece;
a clip placement system for placing at least one of the plurality of conductive clips on the workpiece; and
an oven for assisting in conductive joint formation related to the workpiece after placement of the at least one of the plurality of conductive clips using the clip placement system, the oven including (a) a chamber, the chamber being at least partially defined by (i) an oven plate and (ii) a cover, (b) a material handling system for moving the workpiece through the oven in connection with a conductive joint formation process, (c) at least one vacuum chamber within the chamber, wherein the oven provides a stepped temperature profile including a plurality of temperature zones along the oven plate, and (d) a plurality of heater elements,
the oven plate defining a plurality of grooves, at least one of the plurality of grooves separating adjacent ones of the plurality of temperature zones along the oven plate, the plurality of heater elements controlling a temperature in the plurality of temperature zones.

23. The clip attach system of claim 22 further comprising a die source including a plurality of die, and a placement system for transferring at least one of the plurality of die from the die source to the workpiece.

24. The clip attach system of claim 22 further comprising a die source including a plurality of die, and a flip chip placement system for transferring at least one of the plurality of die from the die source to the workpiece.

25. A method of designing an oven for providing conductive joint formation, the method comprising the steps of:

(a) determining a stepped temperature profile to be provided within a chamber of the oven, the chamber being at least partially defined by (i) an oven plate of the oven and (ii) a cover of the oven, the chamber including at least one vacuum chamber; and (b) providing design details for the oven such that the stepped temperature profile includes a plurality of temperature zones along the oven plate, step (b) including designing the oven plate to define a plurality of grooves, at least one of the plurality of grooves separating adjacent ones of the plurality of temperature zones along the oven plate, the oven including a plurality of heater elements for controlling a temperature in the plurality of temperature zones.

26. The method of claim 25 wherein the oven is configured to provide a substantially uniform temperature within each of the plurality of temperature zones.

27. The method of claim 25 wherein the plurality of heater elements are distributed beneath the oven plate, and are disposed between ones of the plurality of grooves.

28. The method of claim 27 wherein step (b) includes designing the oven plate to define a single one of the plurality of grooves between each of the plurality of temperature zones along the oven plate.

29. The method of claim 27 wherein step (b) includes designing the oven plate to define a subset of the plurality of grooves between each of the plurality of temperature zones along the oven plate.

30. The method of claim 29 wherein step (b) includes designing the oven plate such that at least one groove of the subset of the plurality of grooves is provided with an active cooling fluid.

* * * * *